(12) United States Patent
Ishii et al.

(10) Patent No.: US 11,574,102 B2
(45) Date of Patent: Feb. 7, 2023

(54) PARAMETER ESTIMATION APPARATUS, AIR-CONDITIONING SYSTEM EVALUATION APPARATUS, PARAMETER ESTIMATION METHOD, AND NON-TRANSITORY COMPUTER READABLE MEDIUM

(71) Applicant: KABUSHIKI KAISHA TOSHIBA, Tokyo (JP)

(72) Inventors: Ena Ishii, Kanagawa (JP); Mikito Iwamasa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 210 days.

(21) Appl. No.: 15/700,399

(22) Filed: Sep. 11, 2017

(65) Prior Publication Data

US 2018/0137227 A1 May 17, 2018

(30) Foreign Application Priority Data

Nov. 17, 2016 (JP) .............................. JP2016-224282

(51) Int. Cl.
*G06F 30/13* (2020.01)
*G06F 30/367* (2020.01)
(Continued)

(52) U.S. Cl.
CPC ............ *G06F 30/367* (2020.01); *F24F 11/30* (2018.01); *F24F 11/46* (2018.01); *G06F 30/13* (2020.01);
(Continued)

(58) Field of Classification Search
CPC ............. G06F 17/5036; G06F 17/5004; G06F 17/5009; G06F 30/23; G06F 30/367;
(Continued)

(56) References Cited

U.S. PATENT DOCUMENTS

2010/0114550 A1 5/2010 Fujihara et al.
2011/0246381 A1* 10/2011 Fitch ...................... G06Q 10/04
705/313
(Continued)

FOREIGN PATENT DOCUMENTS

JP 4032426 1/2008
JP 2008-090828 4/2008
(Continued)

OTHER PUBLICATIONS

W. J. Cole, E. T. Hale and T. F. Edgar, "Building energy model reduction for model predictive control using OpenStudio," 2013 American Control Conference, Washington, DC, 2013, pp. 449-454.*

(Continued)

*Primary Examiner* — Andre Pierre Louis
(74) *Attorney, Agent, or Firm* — Finnegan, Henderson, Farabow, Garrett & Dunner, LLP

(57) ABSTRACT

A parameter estimation apparatus of an embodiment of the present invention is provided with a model reduction processor and a parameter estimator. The model reduction processor generates reduced order models by reducing order of a simulation model on the basis of measurement data sets and conditions for model order reduction possibility. The parameter estimator estimates values of parameters of the reduced order models on the basis of the reduced order models and the measurement data sets corresponding to the reduced order models. Further, after estimating a first value for a first parameter of a first reduced order model based on a first measurement data set, the parameter estimator applies the first value to the first parameter of a second reduced order model based on a second measurement data set.

13 Claims, 16 Drawing Sheets

(51) Int. Cl.
  *F24F 11/30* (2018.01)
  *F24F 11/46* (2018.01)
  *G06F 30/20* (2020.01)
  *F24F 110/00* (2018.01)

(52) U.S. Cl.
  CPC .......... *G06F 30/20* (2020.01); *F24F 2110/00* (2018.01); *F25B 2500/19* (2013.01)

(58) Field of Classification Search
  CPC .......... G06F 30/20; G06F 30/25; G06F 30/27; G06F 30/28; G06F 30/17; G06F 30/12; F24F 11/46; F24F 11/30; F24F 2110/40; F24F 2140/10; F24F 2140/12; F25B 2500/19
  See application file for complete search history.

(56) References Cited

U.S. PATENT DOCUMENTS

| | | |
|---|---|---|
| 2012/0323637 A1 | 12/2012 | Cushing et al. |
| 2012/0330465 A1* | 12/2012 | O'Neill ................ F24F 11/30 700/276 |
| 2013/0144546 A1* | 6/2013 | Brackney ............ G06F 17/5004 702/61 |
| 2014/0214220 A1* | 7/2014 | Kamel ................ G05F 1/66 700/291 |
| 2015/0227870 A1* | 8/2015 | Noboa ................ G06Q 10/0635 705/7.28 |
| 2016/0258644 A1 | 9/2016 | Benosman et al. |
| 2016/0258645 A1* | 9/2016 | Boufounos ............ F24F 11/30 |
| 2016/0275222 A1 | 9/2016 | Otsuki et al. |
| 2016/0305678 A1* | 10/2016 | Pavlovski ............ G05B 15/02 |
| 2016/0320073 A1* | 11/2016 | Hieke ................ F24F 5/0017 |
| 2016/0320080 A1* | 11/2016 | Hieke ................ F24D 3/14 |
| 2016/0350459 A1* | 12/2016 | Cruz ................ G06F 30/23 |
| 2016/0378891 A1* | 12/2016 | Deodhar ................ G06F 30/00 703/2 |
| 2017/0167741 A1 | 6/2017 | Otsuki et al. |

FOREIGN PATENT DOCUMENTS

| | | |
|---|---|---|
| JP | 2011-242981 | 12/2011 |
| JP | 2012-043235 | 3/2012 |
| JP | 5509402 | 6/2014 |
| JP | 2016-170715 | 9/2016 |
| JP | 2016-177675 | 10/2016 |
| JP | 2017-110829 | 6/2017 |
| WO | WO 2011/100736 A2 | 8/2011 |

OTHER PUBLICATIONS

Narayanan et al. "A Systems Approach to High Performance Buildings: A Computational Systems Engineering R&D Program to Increase DoD Energy Efficiency" (Year: 2012).*

Braun et al. "Whole Building Control System Design and Evaluation: Simulation-Based Assessment" (Year: 2012).*

Deng et al. "Structure-preserving model reduction of nonlinear building thermal models" (Year: 2014).*

Harish et al. ("Reduced order modeling and parameter identification of a building energy system model through an optimization routine") (Year: 2016).*

Deng et al., "Structure-preserving model reduction of non-linear building thermal models," Automatica (2014), 50:1188-95.

* cited by examiner

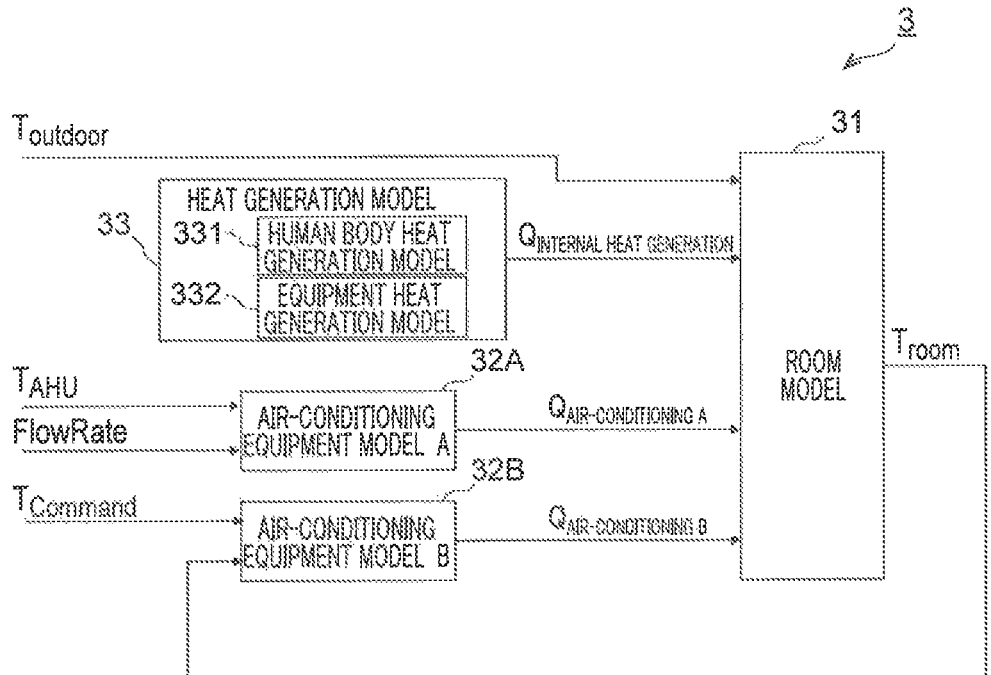

FIG.5

| ID | REDUCIBLE MODEL | CONDITIONS FOR MODEL ORDER REDUCTION POSSIBILITY |
|---|---|---|
| 1 | ROOM MODEL (PARTIAL) | AMOUNT OF CHANGE IN INDOOR TEMPERATURE DURING UNIT TIME IS EQUAL TO OR BELOW PREDETERMINED VALUE |
| 2a | AIR-CONDITIONING EQUIPMENT MODEL | START/STOP DATA INDICATES OFF |
| 2b | AIR-CONDITIONING EQUIPMENT MODEL | ENERGY CONSUMPTION IS CONTINUOUSLY ZERO, OR EQUAL TO OR BELOW PREDETERMINED VALUE FOR CERTAIN PERIOD OR LONGER |
| 3 | INDOOR EQUIPMENT HEAT GENERATION MODEL | POWER CONSUMPTION PER FLOOR AREA IS EQUAL TO OR BELOW PREDETERMINED VALUE |
| 4 | INDOOR HUMAN BODY HEAT GENERATION MODEL | THE NUMBER OF PERSONS PER FLOOR AREA IS EQUAL TO OR SMALLER THAN PREDETERMINED NUMBER OF PERSONS |

| TIME | 0:00 | 0:10 | 0:20 | ... | 4:00 | 4:10 | 4:20 | ... | 7:20 | 7:30 | 7:40 | ... | ... |
|---|---|---|---|---|---|---|---|---|---|---|---|---|---|
| INDOOR TEMPERATURE | 28.0 | 28.0 | 27.9 | ... | 26.0 | 26.0 | 26.0 | ... | 28.0 | 28.1 | 28.2 | ... | ... |
| OUTDOOR TEMPERATURE | 26.0 | 26.0 | 26.0 | ... | 24.0 | 24.0 | 24.0 | ... | 28.0 | 28.0 | 28.0 | ... | ... |
| POWER CONSUMPTION OF AIR-CONDITIONING SYSTEM A | 0.0 | 0.0 | 0.0 | ... | 0.0 | 0.0 | 0.0 | ... | 0.0 | 0.0 | 0.0 | ... | ... |
| POWER CONSUMPTION OF AIR-CONDITIONING SYSTEM B | 0.0 | 0.0 | 0.0 | ... | 0.0 | 0.0 | 0.0 | ... | 0.0 | 10.0 | 15.0 | ... | ... |
| THE NUMBER OF PERSONS IN ROOM | 0 | 0 | 0 | ... | 0 | 0 | 0 | ... | 1 | 5 | 8 | ... | |
| POWER CONSUMPTION OF INDOOR EQUIPMENT | 0.01 | 0.01 | 0.01 | ... | 0.01 | 0.01 | 0.01 | ... | 0.01 | 0.01 | 0.01 | ... | ... |
| ROOM MODEL PARTIALLY REDUCIBLE | × | × | × | ... | ○ | ○ | ○ | ... | × | × | × | ... | ... |
| AIR-CONDITIONING EQUIPMENT MODEL A REDUCIBLE | ○ | ○ | ○ | ... | ○ | ○ | ○ | ... | ○ | ○ | ○ | ... | ... |
| AIR-CONDITIONING EQUIPMENT MODEL B REDUCIBLE | ○ | ○ | ○ | ... | ○ | ○ | ○ | ... | ○ | × | × | ... | ... |
| HUMAN BODY HEAT GENERATION MODEL REDUCIBLE | ○ | ○ | ○ | ... | ○ | ○ | ○ | ... | ○ | × | × | ... | ... |
| EQUIPMENT POWER CONSUMPTION MODEL REDUCIBLE | ○ | ○ | ○ | ... | ○ | ○ | ○ | ... | ○ | ○ | ○ | ... | ... |

MEASUREMENT DATA / JUDGMENT RESULT

MEASUREMENT DATA SET

| ID | REDUCED ORDER MODEL ELEMENT | THE NUMBER OF REDUCED ORDER MODEL ELEMENTS | PARAMETER OF REDUCED ORDER MODEL | CORRESPONDING MEASUREMENT DATA SET |
|---|---|---|---|---|
| 1 | PART OF ROOM MODEL<br>AIR-CONDITIONING EQUIPMENT MODEL A<br>AIR-CONDITIONING EQUIPMENT MODEL B<br>HUMAN BODY HEAT GENERATION MODEL<br>PART OF EQUIPMENT HEAT GENERATION MODEL | 5 | u | X/XX XX:XX — X/XX XX:XX<br>X/XX XX:XX — X/XX XX:XX<br>X/XX XX:XX — X/XX XX:XX |
| 2 | AIR-CONDITIONING EQUIPMENT MODEL A<br>AIR-CONDITIONING EQUIPMENT MODEL B<br>HUMAN BODY HEAT GENERATION MODEL<br>PART OF EQUIPMENT HEAT GENERATION MODEL | 4 | u, c | X/XX XX:XX — X/XX XX:XX<br>X/XX XX:XX — X/XX XX:XX<br>X/XX XX:XX — X/XX XX:XX |
| 3 | AIR-CONDITIONING EQUIPMENT MODEL B<br>PART OF EQUIPMENT HEAT GENERATION MODEL | 2 | u, c, k | X/XX XX:XX — X/XX XX:XX<br>X/XX XX:XX — X/XX XX:XX<br>X/XX XX:XX — X/XX XX:XX |

FIG.9

| ID | REDUCIBLE MODEL CONDITION FOR MODEL ORDER REDUCTION POSSIBILITY | SIMPLIFIABLE MODEL CONDITION FOR MODEL ORDER REDUCTION POSSIBILITY |
|---|---|---|
| 1 | SUB-MODEL OF ROOM MODEL | AMOUNT OF CHANGE IN INDOOR TEMPERATURE DURING UNIT TIME IS EQUAL TO OR BELOW PREDETERMINED VALUE |
| 2a | AIR-CONDITIONING EQUIPMENT MODEL | START/STOP DATA INDICATES OFF |
| 2b | AIR-CONDITIONING EQUIPMENT MODEL | ENERGY CONSUMPTION IS CONTINUOUSLY ZERO, OR EQUAL TO OR BELOW PREDETERMINED VALUE FOR CERTAIN PERIOD OR LONGER |
| 3a | INDOOR EQUIPMENT HEAT GENERATION MODEL | OUTSIDE OPERATION TIME GIVEN BY BUILDING OPERATION CONDITION |
| 3b | INDOOR EQUIPMENT HEAT GENERATION MODEL | POWER CONSUMPTION PER FLOOR AREA IS EQUAL TO OR BELOW PREDETERMINED VALUE |
| 4a | INDOOR HUMAN BODY HEAT GENERATION MODEL | OUTSIDE OPERATION TIME GIVEN BY BUILDING OPERATION CONDITION |
| 4b | INDOOR HUMAN BODY HEAT GENERATION MODEL | THE NUMBER OF PERSONS PER FLOOR AREA IS EQUAL TO OR SMALLER THAN PREDETERMINED NUMBER OF PERSONS |

FIG. 14

- X AXIS (CONTROL VARIABLE): SAT - SUPPLY AIR TEMPERATURE
- Y AXIS (CONTROL VARIABLE): CWT - CHILLER COLD WATER TEMPERATURE
- SETTING: HWT BOILER HOT WATER TEMPERATURE=65 °C
- OPTIMAL POINT:
  CWT=6°C
  SAT=20 °C
- POWER: XXX kW

PARAMETER ESTIMATION APPARATUS, AIR-CONDITIONING SYSTEM EVALUATION APPARATUS, PARAMETER ESTIMATION METHOD, AND NON-TRANSITORY COMPUTER READABLE MEDIUM

CROSS-REFERENCE TO RELATED APPLICATION (S)

This application is based upon and claims the benefit of priority from Japanese Patent Application No. 2016-224282, filed Nov. 17, 2016; the entire contents of which are Incorporated herein by reference.

FIELD

Embodiments described herein relate generally to a parameter estimation apparatus, an air-conditioning system evaluation apparatus, a parameter estimation method, and a non-transitory computer readable medium

BACKGROUND

A method is known in which comparative evaluation is performed by simulation for update or operation change of air-conditioning equipment of a building in order to cope with energy saving of the building. In order to perform the simulation with a high accuracy, it is necessary to identify a lot of parameters included in a simulation model on the basis of variety pieces of measurement data actually measured in the building.

When the number of parameters is large, there is a problem that the number of times of iterative calculation required for identification of the parameters, and time required for identification increases. In order to avoid this problem, a method of reducing the number of parameters is adopted. For example, a method of reducing the number of parameters by identifying parameters that do not influence equipment by multiple regression analysis of measurement data is known. Further, a method of reducing the number of parameters by identifying parameters after classifying measurement data according to classification conditions that influence the parameters is known.

There is, however, a problem that, even for such a parameter that should be constant independently of conditions, for example, a coefficient of heat transmissibility of a wall surface, an individual value is identified for the parameter for each classification condition, and simulation accuracy decreases.

BRIEF DESCRIPTION OF THE DRAWINGS

FIG. 5 is a diagram Illustrating an example of a configuration of a generated simulation model;

FIG. 6 is a diagram illustrating an example of conditions for model order reduction possibility;

FIG. 8 is a diagram illustrating an example of measurement data sets and judgment results of conditions for model order reduction possibility;

FIG. 9 is a diagram illustrating an example of reduced order model information;

FIG. 14 is a diagram illustrating an example of conditions for model order reduction possibility according to a third embodiment;

DETAILED DESCRIPTION

An embodiment of the present invention estimates appropriate values for a plurality of parameters of a simulation model for evaluating an air-conditioning system of a building.

A parameter estimation apparatus of an embodiment of the present invention is provided with a model reduction processor and a parameter estimator. The model reduction processor generates reduced order models by reducing order of a simulation model on the basis of measurement data sets and conditions for model order reduction possibility. The parameter estimator estimates values of parameters of the reduced order models on the basis of the reduced order models and the measurement data sets corresponding to the reduced order models. Further, after estimating a first value of a first parameter of a first reduced order model based on a first measurement data set, the parameter estimator applies the first value to the first parameter of a second reduced order model based on a second measurement data set.

Below, a description is given of embodiments of the present invention with reference to the drawings. The present invention is not limited to the embodiments.

First Embodiment

Figure 1:
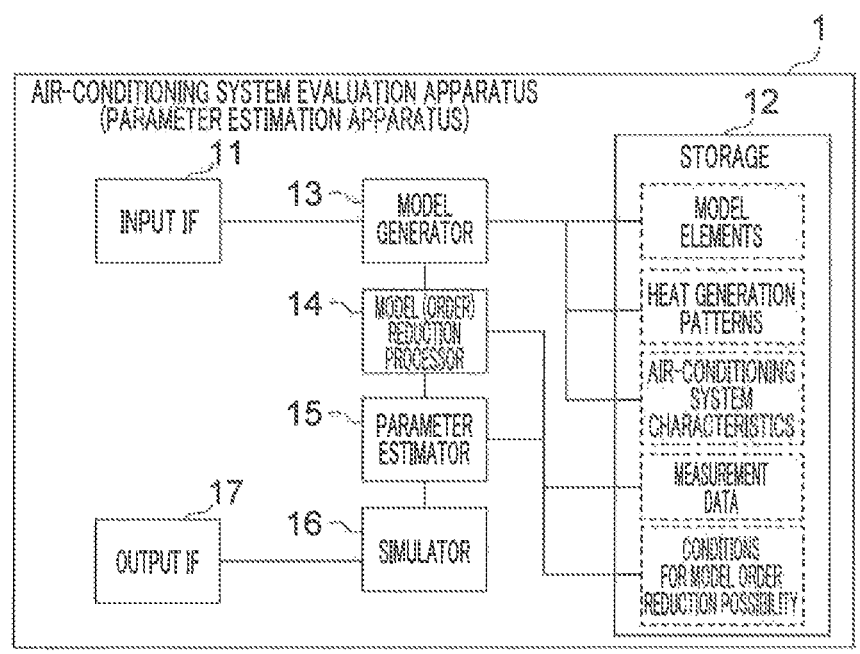
FIG. 1 is a block diagram illustrating an example of a schematic configuration of an air-conditioning system evaluation apparatus according to a first embodiment.

FIG. 1 is a block diagram illustrating an example of a schematic configuration of an air-conditioning system evaluation apparatus according to a first embodiment. An air conditioning system evaluation apparatus 1 illustrated in FIG. 1 is provided with an input interface (input IF) 11, a storage 12, a model generator 13, a model reduction processor 14, a parameter estimator 15, a simulator 16 and an output interface (output IF) 17.

Lines (links) connecting the blocks in FIG. 1 indicate transmission/reception of main data in the present embodiment. However, data transmission/reception may be performed between blocks without a link. For example, the input interface 11 may hand over data not only to the model generator 13 but also to other components. The output interface 17 also may receive data not only from the simulator 16 but also from other components.

The air-conditioning system evaluation apparatus 1 evaluates an air-conditioning system of a building. The air-conditioning system of the building may be such that is actually installed in the building or may be such that is assumed to be installed. As evaluation items, performance and energy consumption of the air-conditioning system and the like are conceivable. The air-conditioning system evaluation apparatus 1 performs simulation for a simulation model for the air-conditioning system to evaluate the air-conditioning system. At that time, the air-conditioning system evaluation apparatus 1 generates the simulation model, simplifies the simulation model (in other words, reduces order of the simulation model) and estimates values of a plurality of parameters of the simulation model.

Figure 2:
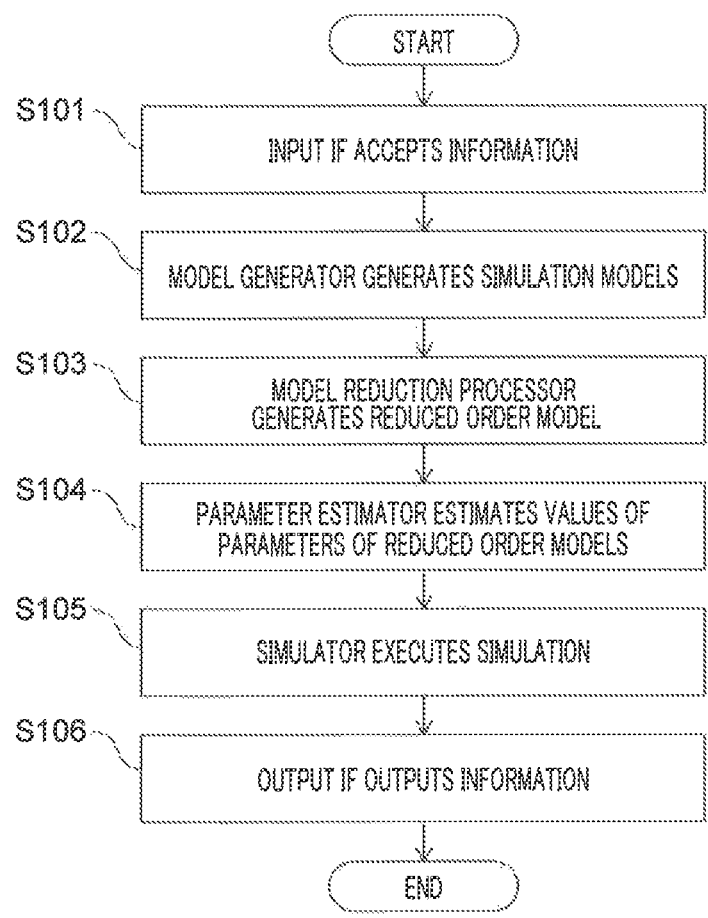
FIG. 2 is a diagram illustrating an example of a schematic flowchart of an overall process of the air-conditioning system evaluation apparatus according to the first embodiment.

FIG. 2 is a diagram Illustrating an example of a schematic flowchart of an overall process of the air-conditioning system evaluation apparatus according to the first embodiment. The input interface 11 accepts information (S101), and the model generator 13 generates a simulation model on the basis of the information the input interface 11 has accepted and the like (S102). Order of the generated simulation model is reduced by the model reduction processor 14. Hereinafter, the model obtained by reducing order of simulation model is referred to as a reduced order model. That is, a reduced order model is generated (S103). Then, the parameter estimator 15 estimates values of parameters of the reduced order model (S104). The simulator 16 executes simulation for the simulation model on the basis of the calculated estimates (S105), and the output interface 17 outputs desired information such as a simulation result (S106). The above is a flow of the schematic process. Details of the process will be described later together with the components of the air-conditioning system evaluation apparatus 1.

The air-conditioning system evaluation apparatus 1 can be also used as a parameter estimation apparatus for calculating estimates of parameters of a simulation model. In the case of the parameter estimation apparatus, for example, in the above flow, calculated estimates of parameters may be outputted in the process of S106 without the process of S105 being performed. Further, the outputted estimates of parameters may be modified by a user, and the simulation of S105 may be performed on the basis of the values modified by the user.

The components of the air-conditioning system evaluation apparatus 1 will be described.

At the time of performing simulation, the input interface 11 accepts information from the user, an external apparatus or the like. In the present embodiment, it is assumed that the input interface 11 accepts Information about an outline of a building in which an evaluation target air-conditioning system is to be installed. Hereinafter, the information will be referred to as building information. Specifically, the building information includes information at least about any of the location, intended use, area, number of floors, age, structure and wall surface material of the building. Further, the building information may be detailed design information such as a BIM (Building Information Model) written in a gbxml format.

Figure 3:
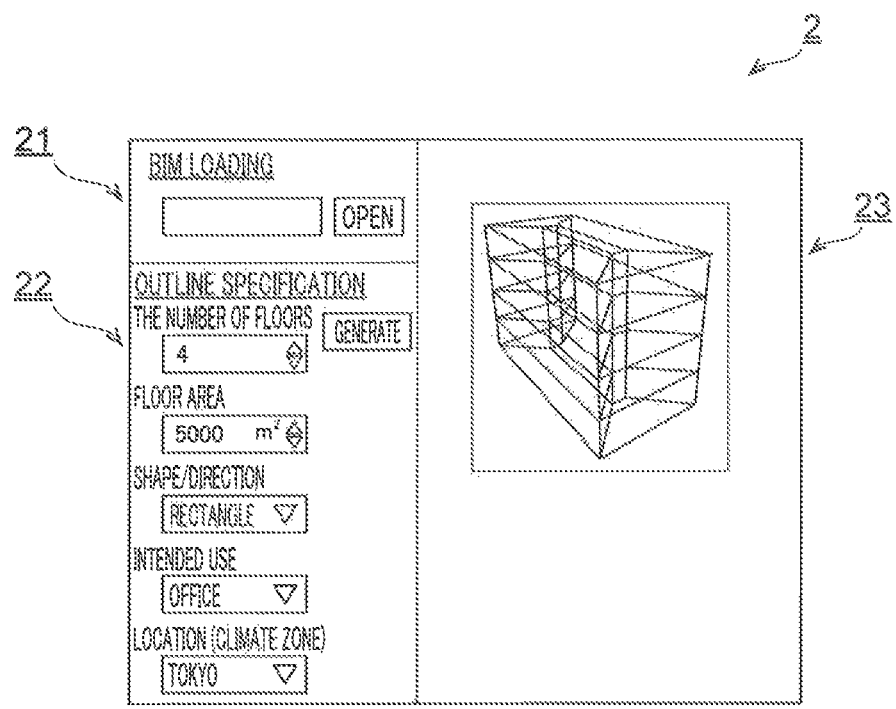
FIG. 3 is a diagram Illustrating an example of an interface for inputting building information.

FIG. 3 is a diagram Illustrating an example of an interface for inputting building information. In FIG. 3, a building information input interface 2, which is an example of the interface for inputting building information is shown. For example, when the user inputs building information, the input interface 11 displays the building information Input interface 2 illustrated in FIG. 3 on a display or the like that is wiredly or wirelessly connected. A BIM loading area 21 shown on an upper left part of the building information input interface 2 is an area for inputting detailed design information such as a BIM. An outline specification area 22 shown on a part from middle left to lower left is an area for inputting an outline of a building. In FIG. 3, the number of floors, floor area, shape/direction, intended use and location are shown as outline items to be used. By specifying any of these, the building information is inputted. After inputting the building information, a building based on the inputted building information may be displayed in an image display area 23 shown on a right part.

The method for the input interface 11 to accept information is not limited to the Interface described above. For example, information may be accepted by downloading a file or the like in which the information is stored. Further, an external storage device in which information is stored may be referred to. Further, the input interface 11 may display an interface other than the building information Input interface 2 to accept information other than the building information. As for the method of the input interface 11 accepting information, the same goes for other embodiments described later.

The storage 12 stores information required for processes performed by the air-conditioning system evaluation apparatus 1. As the information stored in the storage 12, there are model elements, heat generation patterns, air-conditioning system characteristics, measurement data, a reference list, conditions for model order reduction possibility and the like. These pieces of information will be described later.

The storage 12 may store information accepted by the input interface 11 such as the building information. Further, the storage 12 may acquire and store a result of a process of each component of the air-conditioning system evaluation apparatus 1.

For example, a generated simulation model or reduced order model obtained from the simulation model, estimates of parameters, a simulation result and the like may be stored. The information stored in the storage 12 may be referred to by each component of the air-conditioning system evaluation apparatus 1.

The air-conditioning system evaluation apparatus 1 may have a plurality of storages. That is, the storage 12 may be configured with a plurality of storages. For example, the storage 12 may include a storage storing model elements, a storage storing heat generation patterns, a storage storing air-conditioning system characteristics and a storage storing measurement data. Further, the storage 12 may be realized by a database in order to perform extraction, search and the like of data.

The model element means a model (a component) which is a part of a simulation model for an air-conditioning system and constitutes the simulation model. As the model element, there is, for example, an air-conditioning equipment model showing an amount of heat by the air-conditioning system. A model element stored in the storage 12 includes a numerical expression indicating the model element, and the like.

The model elements may be numerical expressions written in a programming language such as Modelica and Python, or may be an input list for energy simulation specified in standards such as ISO 13790:2008, or may be what is written in an IDF format which is an input data format of EnergyPlus.

The heat generation pattern means a pattern of temporal change of heat generated in a building. A heat generation source is not especially limited, and heat generation from a living body, equipment and the like is also possible. For example, when there are offices which persons enter and exit, in a building, a heat generation pattern in the offices is such that heat generation pattern is high in a time zone during which persons exist, for example, during the daytime and is low in a time zone during which persons do not exist, for example, at night. On the other hand, when there is an area such as a room in which only a continuously operating machine is placed, in a building, a heat generation pattern in this area is almost constant independently of time zones. Thus, heat generation patterns differ depending on intended uses of buildings or areas in buildings and the like.

The air-conditioning system characteristics means information about equipment constituting an air-conditioning system. The equipment constituting an air-conditioning system is not especially limited. For example, there are kinds such as a pump, piping, an air handling unit, a package-type air-conditioning machine, a multi-type air-conditioning machine for building and the like. As the air-conditioning system characteristics, there are, for example, rated capacity for each model of the above pieces of equipment, a characteristic showing a relationship between a load factor and efficiency, energy consumption during rated operation, and the like.

The measurement data means data measured by sensors or equipment provided with sensors in a building provided with an air-conditioning system. The measurement data includes, for example, temperature, humidity, power consumption of equipment, operation information about equipment, the number of persons who enter and exit the building or a particular area in the building. The measurement data may be measured inside the building or outside the building. That is, temperature (outside temperature) and humidity outside the building may be Included. Further, the equipment provided with sensors may be equipment constituting the air-conditioning system or other equipment. The operation information about equipment may include, for example, start/stop (operating state/stopped state) of equipment, set temperature, air supply temperature, air quantity, water temperature, flow rate and the like.

The information stored in the storage 12 may be stored in the storage 12 in advance by the user or may be stored by the air-conditioning system evaluation apparatus 1 acquiring the information from an external apparatus or system. In the case of acquiring the information from an external apparatus or system, the air-conditioning system evaluation apparatus 1 is directly or indirectly connected to the external apparatus or system via a communication interface, a device interface, or the like so that data transmission/reception is possible. Information required for data transmission/reception, such as an IP address, can be stored in the storage 12 in advance.

The model generator 13 generates a simulation model for an air-conditioning system. Specifically, the model generator 13 generates the simulation model on the basis of the building information, the model elements, the heat generation pattern and the air-conditioning system characteristics.

Figure 4:
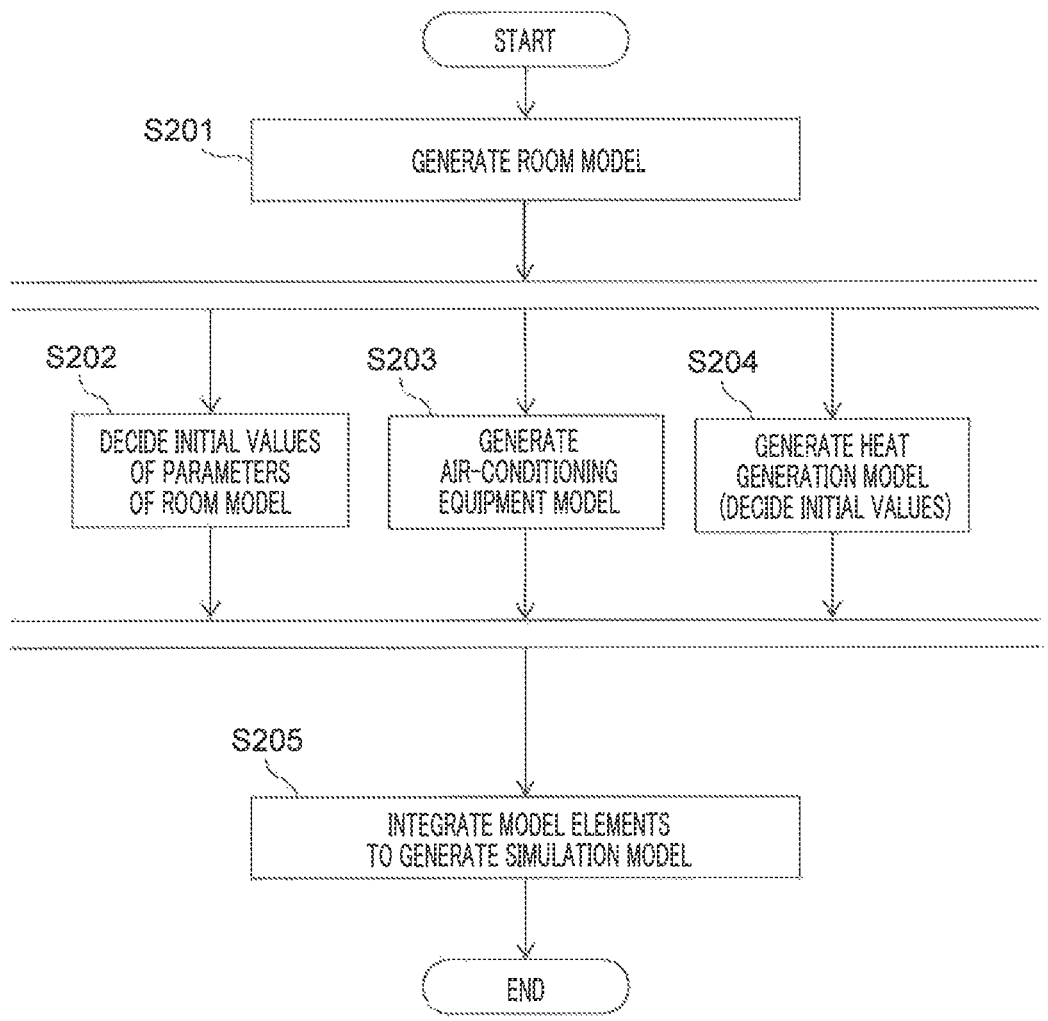
FIG. 4 is a diagram illustrating an example of a flowchart of a process of a model generator according to the first embodiment.

A process performed by the model generator 13 will be described along a flow of the process. FIG. 4 is a diagram illustrating an example of a flowchart of the process of the model generator according to the first embodiment. In the present embodiment, it is assumed that the model elements are expressed by numerical expressions.

The model generator 13 generates a room model corresponding to a building provided with an air-conditioning system (S201). The room model is a model showing an amount of heat of a room of the building. The room indicates a partial or the whole area of the building. That is, the room may be the whole building, or may be one section when the area of the building is equally divided, or may be a room that actually exists in the building. An example of the generated room model is shown by the following Expression. Here, the whole building is assumed to be one room. On this assumption, the room means the building.

[Expression 1]

$$C\frac{dT_{room}}{dt} = Q_{air-conditioning\ A} + Q_{air-conditioning\ B} + Q_{outer\ wall} + Q_{internal\ heat\ generation} \quad (1\text{-}1)$$

$$Q_{outer\ wall} = (T_{outdoor} - T_{room}) \times U \times A \quad (1\text{-}2)$$

Here, "T" means temperature, and the subscript of "T" indicates the place of the temperature; "$T_{outdoor}$" and "$T_{room}$" indicate outside temperature and room temperature, respectively. Further, "Q" indicates an amount of heat, and the subscript of "Q" indicates the generation source of the amount of heat. Further, "$Q_{air-conditioning\ A}$", "$Q_{air-conditioning\ B}$", "$Q_{outer\ wall}$" and "$Q_{internal\ heat\ generation}$" indicate an amount of heat given by an air-conditioning system A, an amount of heat given by an air-conditioning system B, an amount of heat from an outer wall and an amount of heat (an amount of heat generation) emitted from a living body, an apparatus and the like existing in the room or the like, respectively. For the amount of heat given by an air-conditioning system, an amount of heat by each pieces of equipment belonging to the air-conditioning system is considered.

In the example of Expression (1-1), it is assumed that the air-conditioning system A and the air-conditioning system B exist in the building. The air-conditioning systems A and B are different types of air-conditioning systems. For example, they are an air-conditioning system the main purpose of which is ventilation and an air-conditioning system the main purpose of which is temperature adjustment. Which air-conditioning system the building is provided with can be included in the building information or the air-conditioning system characteristics.

Further, "C" is a parameter indicating a coefficient showing an amount of change in room temperature relative to ingress/egress of heat into/out of the room; "U" is a parameter indicating a coefficient showing heat transmissibility of a wall; and "A" is a parameter indicating a surface area of the building (room), Therefore, the room model shown by Expression 1 is a model of calculating the room temperature "$T_{room}$" with the outside temperature "$T_{outdoor}$", the amounts of heat "$Q_{air-conditioning\ A}$", "$Q_{air-conditioning\ B}$" and "$Q_{internal\ heat\ generation}$" as an input.

When there are a plurality of rooms, a room model is generated for each room. Further, for the room model for each room, heat exchange between rooms is considered. Specifically, an amount of heat exchanged with an adjoining room is added to Expression (1-1), and a heat exchange Expression Indicating the amount of heat exchanged with the adjoining room is added. For example, when there are two rooms, Room 1 and Room 2, the heat exchange Expression indicating an amount of heat that flows in from Room 2, in the model of Room 1 is shown by Expression (1-3) below:

[Expression 2]

$$Q_{room\ 21} = (T_{room2} - T_{room1}) \times U_{21} \times A_{21} \quad (1\text{-}3)$$

Here, "$T_{room1}$", "$T_{room2}$", "$U_{21}$" and "A21" indicate a room temperature of Room 1, a room temperature of Room 2, a parameter indicating heat transmissibility between Room 1 and Room 2, and an area of a part where Room 1 and Room 2 are in contact, such as a wall, respectively. Further, an Expression obtained by exchanging "$T_{room1}$" and "$T_{room2}$" in Expression (1-3) with each other is a heat exchange Expression for heat exchange with Room 1 in the model of Room 2.

Next, the model generator 13 decides initial values of parameters for which estimates are calculated by the parameter estimator 15 (S202). The parameters for which estimates are calculated by the parameter estimator 15 are specified in advance and are assumed to be constant values at least during a period during which measurement data used for creation of a reduced order model is measured. For example, heat transmissibility of a wall is thought*to change due to aged deterioration but can be considered not to change in a short time, such as in a day or week, during which measurement data is measured. In the above example, initial values for the parameters "C", "U" and "A" are decided. Though final estimates of the parameters are decided by the parameter estimator 15, the initial values of the parameters are decided by the model generator 13. The model generator 13 decides the initial values of the parameters on the basis of the building information.

An example of a method for calculating the initial values will be described. First, the model generator 13 calculates a value of the parameter "C" per unit volume on the basis of the building information and the reference list. The reference list shows a relationship between building information and a value of the parameter "C" per unit volume. For example, the reference list may be a table of correspondence between intended uses of rooms and values of the parameter "C" per unit volume. If the room is an exercise facility such as a gymnasium, there are few things in the room, and, therefore, it is thought that the room temperature easily changes. On the other hand, if the room is a warehouse or the like, there are a lot of things in the room, and, therefore, it is thought that the room temperature does not easily change. Thus, relationships between pieces of building information assumed to be related to the parameter "C" and values of the parameter "C" per unit volume can be specified in advance to make a reference list. The relationships do not have to be strict because they are used for initial values. The reference list may be stored in the storage 12 or may be included in the building information. The parameter "C" may be calculated by multiplying the value of the parameter "C" per unit volume by the volume of the building calculated on the basis of the floor area and floor height included in the building information.

The parameter "U" may be similarly calculated from the reference list on the basis of an intended use, age, location and the like. For example, if the location is in a cold district, it is assumed that high-performance insulating material is used for outer walls, and, therefore, it is assumed that a value of the parameter "U" is large. Further, if the age is large, the performance of the insulating material is low, and aged deterioration and the like exist. Therefore, it is assumed that the parameter "U" is small. If the intended use is a warehouse that does not require insulation, it is assumed that the parameter "U" is small.

The parameter "A" can be calculated on the basis of the building information. When it is possible to accurately perform calculation on the basis of the building information, the calculated value may be set not as an initial value but as an estimate, and a setting for excluding the value from targets by estimate calculation may be made for the parameter estimator 15.

Next, the model generator 13 generates air-conditioning equipment models corresponding to the air-conditioning systems (S203). The air-conditioning equipment model is a model showing an amount of heat by an air-conditioning system. An example of the air-conditioning equipment model is shown by the following Expression:

[Expression 3]

$$Q_{air-conditioning\ A} = a \frac{FlowRate}{T_{AHU} - T_{room}} \quad (2\text{-}1)$$

$$Q_{air-conditioning\ B} = K(T_{command} - T_{room}) \quad (2\text{-}2)$$

The air-conditioning equipment model shown by Expression 3 includes two models, a model for the air-conditioning system A (2-1) and a model for the air-conditioning system B (2-2). The air-conditioning system A is assumed to be an air-conditioning system the main purpose of which is ventilation. The air-conditioning system B is assumed to be an air-conditioning system the main purpose of which is temperature adjustment. Here, "FlowRate", "$T_{AHU}$" and "a" shown in Expression (2-1) Indicate an air quantity to be ventilated (an air supply amount), temperature of air supplied from the air-conditioning system (air supply temperature) and a constant specified by specific heat of air or the like, respectively. Further, "$T_{command}$" and "K" shown in Expression (2-2) indicate target room temperature and a constant that differs depending on air-conditioning systems. Thus, an air-conditioning equipment model is a model of calculating the amount of heat given into a room from the air-conditioning system with the air supply amount "FlowRate", the air supply temperature "$T_{AHU}$", the target room temperature "$T_{command}$" and the like as an input.

The kinds and rated capacities of the air-conditioning systems may be Included in the building information or may be decided on the basis of the building information. For example, a reference list showing relationships between Intended uses, floor areas, locations and the like of buildings, and rated capacities of air-conditioning systems is generated in advance, and the rated capacities may be decided from the intended use, floor area, location and the like of the building.

Next, the model generator 13 generates a heat generation model (S204). The heat generation model is a model showing an amount of heat generation by a heat generation source existing in the room and is a model for calculating an amount of heat generation "$Q_{internal\ heat\ generation}$" to be included in the room model. The model generator 13 generates the heat generation model on the basis of the building Information and a heat generation pattern. For example, when a heat generation pattern per unit area of the room corresponds to the intended use included in the building information, the model generator 13 extracts the heat generation pattern from the storage 12 on the basis of the intended use of the room, and generates the heat generation model by multiplying the extracted heat generation pattern by the floor area included in the building information. An example of the heat generation model is shown by the following Expression:

[Expression 4]

$$Q_{human\ body\ heat\ generation} = f(t) \quad (3\text{-}1)$$

$$Q_{equipment\ heat\ generation} = g(t) \quad (3\text{-}2)$$

$$Q_{internal\ heat\ generation} = k_1 Q_{human\ body\ heat\ generation} + k_2 Q_{equipment\ heat\ generation} \quad (3\text{-}3)$$

Here, "f(t)" and "g(t)" Indicate heat generation patterns of an amount of human body heat generation "$Q_{human\ body\ heat\ generation}$" and an amount of equipment heat generation "$Q_{equipment\ heat\ generation}$", respectively, at time "t" in a certain room. Here, "k" is a parameter indicating a coefficient showing an amount heat generation of the whole room "$Q_{internal\ heat\ generation}$" relative to a sum of the amount of human body heat generation "$Q_{human\ body\ heat\ generation}$" and the amount of equipment heat generation "$Q_{equipment\ heat\ generation}$". An initial value of the parameter "k" may be a value such as 1. Otherwise, the initial value may be decided similarly to the initial value of the parameters for the room model. Thus, the heat generation model shown by Expression 3 is a model of calculating the amount of heat "$Q_{internal\ heat\ generation}$" with the time t as an input.

The model generator 13 integrates the room model, the air-conditioning equipment model and the heat generation model to generate a simulation model (S205). FIG. 5 is a diagram illustrating an example of a configuration of the generated simulation model. In FIG. 5, a generated simulation model 3 is shown, and a room model 31, an air-conditioning equipment model 32A, an air-conditioning equipment model 32B and a heat generation model 33 are shown as model elements of the simulation model 3. Since there are two different kinds of air-conditioning systems, the two air-conditioning equipment models are shown. The heat generation model 33 includes a human body heat generation model 331 and an equipment heat generation model 332. When a variable name of output of a certain model element corresponds to a variable name of input of another model element, the model generator 13 connects the output of the certain model element and the input of that another model element with a link. Thereby, a simulation model in which model elements are mutually connected is generated. The above is the flow of the process of the model generator 13.

As described above, the model generator 13 generates a simulation model at least including a room model showing an amount of heat of a room of a building provided with an air-conditioning system, an air-conditioning equipment model showing an amount of heat by the air-conditioning system, and a model showing an amount of heat generation by a heat generation source existing in the room as components.

The model reduction processor 14 generates a reduced order model corresponding to a measurement data set by reducing order of the simulation model on the basis of the measurement data set and conditions for model order reduction possibility. The measurement data set means measurement data collected for each unit period. The model order reduction means to omit or simplify a part of model elements included in a simulation model. For example, there is model order reduction in which, on the assumption that heat generation from a human body can be ignored, the human heat generation model is omitted. Further, there is model order reduction in which, if temperature change is at a negligible level, the left-hand side of Expression (1-1) is simplified to 0. The conditions for model order reduction possibility are conditions for performing model order reduction.

FIG. 6 is a diagram illustrating an example of the conditions for model order reduction possibility. In FIG. 6, the conditions for model order reduction possibility are shown as a list. Conditions for model order reduction possibility that are not applied may exist. For example, though a condition for model order reduction possibility with an ID of 2a and a condition for model order reduction possibility with an ID of 2b are set for the air-conditioning equipment model in FIG. 6, any one of or both of them may be applied. In the case of FIG. 6, it may be assumed that the condition 2a is used when data about start/stop of the air-conditioning is included in measurement data, and the condition 2b is used when consumption energy data is included in the measurement data. It may be assumed that either of the conditions for model order reduction possibility is applicable, and preference is given to a condition for model order reduction possibility with a higher priority if results of application are different. For example, a rule may be defined that a condition on a higher line in the list of conditions for model order reduction possibility is given preference. Further, a process performed when a condition for model order reduction possibility is satisfied, that is, content of model order reduction may be set in the list of conditions for model order reduction possibility.

Figure 7:
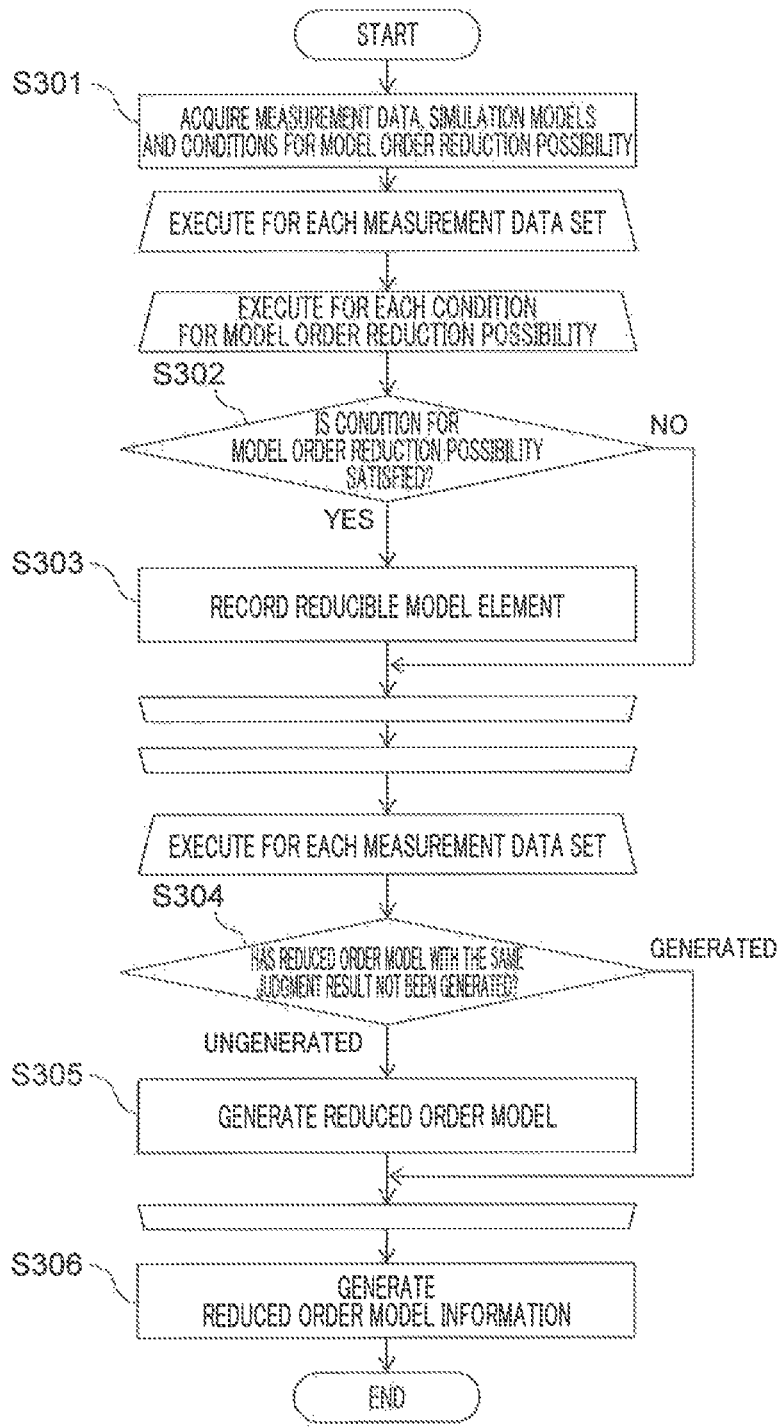
FIG. 7 is a diagram illustrating an example of a flowchart of a process of a model reduction processor according to the first embodiment.

The process performed by the model reduction processor 14 will be described along a flow of the process. FIG. 7 is a diagram illustrating an example of a flowchart of the process of the model reduction processor according to the first embodiment. The model reduction processor 14 acquires measurement data, a simulation model, and conditions for model order reduction possibility for model elements included in the simulation model (S301).

Next, the model reduction processor 14 judges, for each measurement data set of the measurement data, whether the measurement data set satisfies a condition for model order reduction possibility (S302). If the measurement data set does not satisfy the condition for model order reduction possibility (S302: NO), the model reduction processor 14 proceeds to judgment of the next condition for model order reduction possibility. If the condition for model order reduction possibility is satisfied (S302: YES), the model reduction processor 14 records the reducible model element (S303) and proceeds to judgment of the next condition for model order reduction possibility. When all the conditions for model order reduction possibility are confirmed, the model reduction processor 14 proceeds to confirmation of the next measurement data set. In this way, all the conditions for model order reduction possibility are judged for all the measurement data sets.

FIG. 8 is a diagram Illustrating an example of measurement data sets and judgment results of the conditions for model order reduction possibility. Measurement data Is shown at an upper part (the second to seventh lines) of FIG. 8, and judgment results based on the measurement data sets are shown at a lower part (the eighth to twelfth lines). A set of measurement data shown on the second to seventh lines in each column is a measurement data set. Whether the conditions for model order reduction possibility shown in FIG. 6 are satisfied or not is judged on the basis of the measurement data set, and results of the judgments are stored in the eighth to twelfth lines in the same column. For example, in the second column of the table in FIG. 8, it is shown that, for a measurement data set at time 0:00, model order reduction of a part of the room model is judged to be Impossible (x in FIG. 8) but, for other conditions for model order reduction possibility, model order reduction is judged to be possible (○ in FIG. 8). As for the recording of the judgment results at S303, for example, initial values of judgment results for conditions for model order reduction possibility that have been judged to be satisfied may be changed from x to ○ as in FIG. 8, or only judgment results for conditions for model order reduction possibility that have been judged to be satisfied may be recorded.

Then, for each measurement data set, the model reduction processor 14 generates a reduced order model on the basis of judgment results of the conditions for model order reduction possibility. Specifically, the model reduction processor 14 confirms whether a reduced order model for a measurement data set for which judgment results of conditions for model order reduction possibility are the same as those of a measurement data set currently targeted by the process has not been generated yet (S304). If the reduced order model has not been generated (S304: UNGENERATED), the model reduction processor 14 generates a reduced order model corresponding to the measurement data set currently targeted by the process on the basis of the judgment results of the conditions for model order reduction possibility (S305). If the reduced order model has already been generated (S304: GENERATED), the model reduction processor 14 proceeds to the next reduced order model without generating the reduced order model. Thereby, reduced order models are generated for measurement data sets having different reducible model elements, among the plurality of measurement data sets.

For example, in the case of processing a measurement data set at time 0:10 after generating a reduced order model for the measurement data set at the time 0:00 in FIG. 8, a reduced order model for the measurement data set at the time 0:10 is not generated because judgment results of the measurement data set at the time 0:00 and judgment results of the measurement data sets at the time 0:10 are the same. That is, one reduced order model is generated for each combination of judgment results of conditions for model order reduction possibility.

Lastly, the model reduction processor 14 generates information about the generated reduced order models (S306). This information is referred to as reduced order model Information. FIG. 9 is a diagram illustrating an example of the reduced order model information. The reduced order model information includes IDs of reduced order models, the number of reduced order model elements, parameters of the reduced order models, measurement data sets corresponding to the reduced order models, and the like. The parameters of reduced order models are parameters remaining in the reduced order models without being deleted by model order reduction. The reduced order model information may include information Indicating which part of a simulation model is omitted or simplified. The reduced order model information becomes information for deciding order of processing, estimation target parameters and measurement data sets to be used in a process performed by the parameter estimator 15. The above is the flow of the process of the model reduction processor 14.

The parameter estimator 15 estimates values of the parameters of the reduced order models on the basis of the reduced order models and the measurement data sets corresponding to the reduced order models. An estimate calculation process will be described along a flow of the process.

Figure 10:
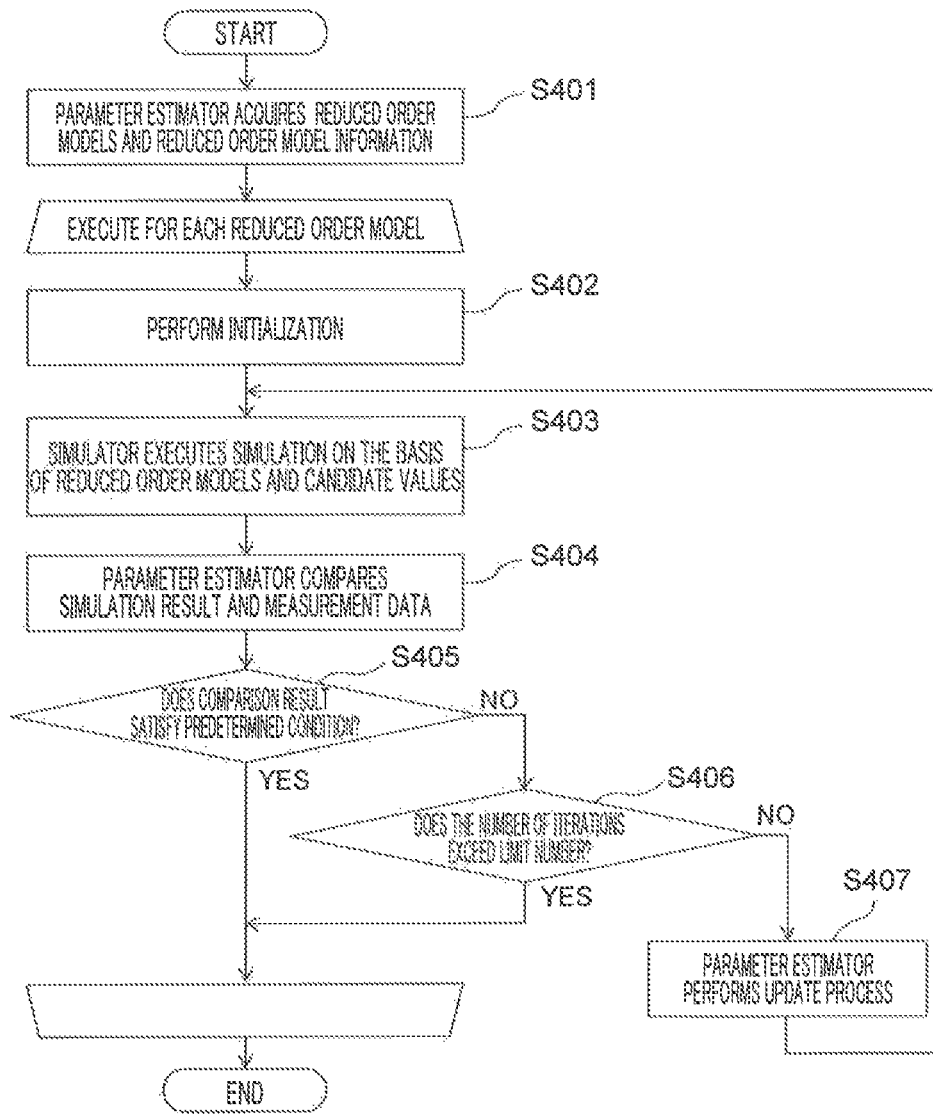
FIG. 10 is a diagram illustrating an example of a flowchart of an estimate calculation process.

FIG. 10 is a diagram illustrating an example of a flowchart of the estimate calculation process. The parameter estimator 15 acquires the reduced order models and the reduced order model information (S401).

Then, for each reduced order model, the parameter estimator 15 estimates values of parameters of the reduced order model. At this time, the parameter estimator 15 uses a measurement data set corresponding to the reduced order model shown in the reduced order model information.

Further, in the present embodiment, sequential order of the reduced order models to be processed is decided on the basis of the number of reduced order model elements shown in the reduced order model information. Specifically, the parameter estimator 15 estimates values of parameters for a reduced order model with a larger number of reduced order model elements earlier. In the example of FIG. 9, the number of reduced order model elements of a reduced order model with ID 1, the number of reduced order model elements of a reduced order model with ID 2 and the number of reduced order model elements of a reduced order model with ID 3 are 5, 4 and 2, respectively. Therefore, values of parameters of the reduced order models are estimated in order of ID 1, ID 2 and ID 3.

The process for each reduced order model is performed as below. First, the parameter estimator 15 initializes the reduced order model (S402). The initialization means to set initial values for parameters of the reduced order model and to set the number of iterations of regression calculation to 0. The initial values are initial values calculated by the model generator 13. Next, the parameter estimator 15 inputs the reduced order model for which the values of the parameters are set, to the simulator 16. The simulator 16 executes simulation for the inputted reduced order model and calculates a simulation result (S403).

Next, the parameter estimator 15 makes a judgment on the basis of the simulation result and a measurement data set corresponding to the reduced order model. Then, a process is decided on the basis of a judgment result. For example, the simulation result and the corresponding measurement data set are compared (S404). If a difference is equal to or below a predetermined threshold (S405: YES), it is assumed that a predetermined condition is satisfied, and a value of a parameter at that point of time is set as an estimate. If the difference is larger than the threshold (S405: NO), it is assumed that the predetermined condition is not satisfied, and the number of iterations of regression calculation is confirmed (S406). If the number of iterations of regression calculation exceeds the limit number of times (S406: YES), the value of the parameter at that point of time may be set as an estimate. Otherwise, an estimate may be selected from among parameter values set before. If the number of iterations of regression calculation does not exceed the limit number of times (S406: NO), the parameter estimator 15 performs an update process. The update process is a process of changing the value of the parameter to a new value and adding 1 to the number of iterations of regression calculation. The new value may be calculated, for example, by adding a predetermined amount of change to a current value. Then, simulation for the reduced order model is performed on the basis of the new parameter value (S403). The process from S403 to S407 is repeated, and estimates of the parameters are determined.

In the above, the values of the parameters set by the parameter estimator 15 are defined as candidate values. The candidate values are candidates for estimates. That is, in the first calculation, the parameter estimator 15 sets the initial values as the candidate values. Then, a judgment is made on the basis of a simulation result and the measurement data set corresponding to the reduced order model, and it is decided whether the initial values are to be estimates, on the basis of a judgment result. In the second and subsequent calculations, the parameter estimator 15 calculates new candidate values, and decides whether the new candidate values are to be estimates similarly. As the method for calculating new candidate values, a well-known method such as an optimization method may be used.

After the above process is performed for the first reduced order model, the same process is performed for the next reduced order model. At this time, for parameters for which estimates have been specified by the previous process, the calculated estimates are applied to the parameters in the initialization process of S402, and the parameters are excluded from targets of the update process of S407. For example, after calculating an estimate for a parameter "U" of a reduced order model based on a measurement data set at time 4:00, the parameter estimator 15 applies the estimate calculated earlier, for the parameter "U" of a reduced order model based on the measurement data set at the time 0:00. This is because, since the value of the parameter "U" is assumed not to change during a period between the time 0:00 and the time 4:00 when the measurement data sets are measured, the estimate value of the parameter "U" is regarded as a constant value independently of individual reduced order models. In this way, the process is performed for all the reduced order models, and the estimate calculation process ends.

Therefore, in the present embodiment, even though a reduced order model for each measurement data set is generated, parameters the values of which should not fluctuate are unique values.

The simulator 16 performs simulation for the simulation model of the air-conditioning system on the basis of the estimates of the parameters, and calculates simulation results of the air-conditioning system. Thus, it is possible to calculate a simulation result for evaluating an air-conditioning system by appropriate parameter values.

The simulator 16 may be realized by an energy simulation program such as EnergyPlus and TRANSYS, or may be realized by a general-purpose program execution environment such as MATLAB/Simulink, Modelica and Python, or may be realized by a combination of a simulation program written in a general-purpose programming language such as C++ and Fortran and a compiler for compiling the program.

In the above description, the simulator 16 performs simulation for reduced order models on the basis of candidate values. However, simulation for reduced order models and simulation for a simulation model of an air-conditioning system may be performed by different simulators. That is, the air-conditioning system evaluation apparatus 1 may be provided with a first simulator configured to perform simulation for reduced order models on the basis of candidate values and a second simulator (air-conditioning system simulator) configured to perform simulation for a simulation model on the basis of estimates calculated by the parameter estimator 15. The first simulator may be included in the parameter estimator 15. The first simulator and the second simulator have the same simulation environment or may have different simulation environments. For example, in order to reduce a load on one of both simulations, the one simulation may be simpler than the other simulation.

Figure 11:
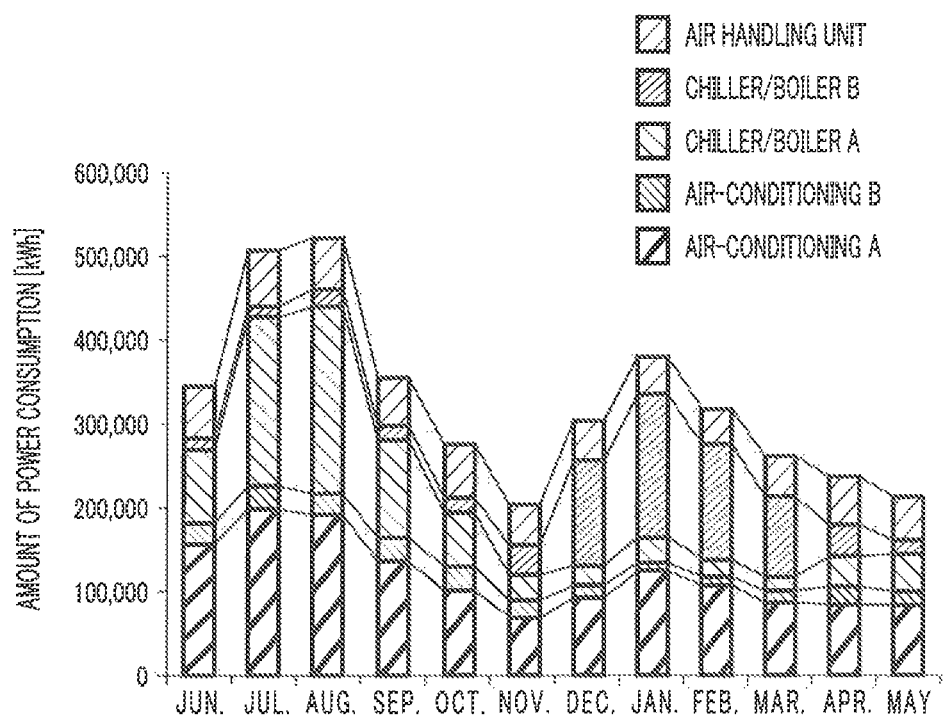
FIG. 11 is a diagram illustrating an example of a simulation result of an air-conditioning system according to the first embodiment.

The output interface 17 receives information from each component of the air-conditioning system evaluation apparatus 1 and outputs the received information. For example, the output interface 17 displays a simulation result of the air-conditioning system. The output interface 17 may display the simulation result of the air-conditioning system using a simulation result display interface for displaying a simulation result of an air-conditioning system. FIG. 11 is a diagram illustrating an example of a simulation result of an air-conditioning system according to the first embodiment. FIG. 11 shows an amount of energy consumption of each piece of equipment related to the air-conditioning system for each month in one year as a simulation result. The amount of energy consumption in FIG. 11 is configured with amounts of energy consumption of an air handling unit, the air-conditioning system A, the air-conditioning system B, a chiller/boiler A and a chiller/boiler B. The simulation result of the air-conditioning system may show temperature in a room or may be a load factor or an operation rate of each piece of equipment.

The information outputted from the output interface 17 is not especially limited. A processing result of each component of the air-conditioning system evaluation apparatus 1 may be outputted. For example, the information may be a simulation model, reduced order models, results judgments of conditions for model order reduction possibility, reduced order model Information and estimates of parameters. Further, model elements, heat generation patterns, air-conditioning system characteristics, measurement data, a reference list, conditions for model order reduction possibility and the like may be outputted. Further, as an output method, an image may be displayed on a display, or the information converted to file format data may be transmitted.

As described above, according to the present embodiment, a part of parameters are identified using a reduced order model based on measurement data in a certain time zone, and remaining parameters are identified using a reduced order model based on measurement data in another time zone. Thereby, it is possible to prevent a situation in which the value of a parameter that should not fluctuate differs for each reduced order model. Further, since the number of parameters to be estimated is reduced, a processing load is reduced, and processing time can be shortened. Thus, it is possible to realize an air-conditioning system evaluation apparatus adapted to a building.

The above embodiment is a mere example, and the air-conditioning system evaluation apparatus 1 may be configured, for example, by a model generation machine provided with the model generator 13, the model reduction processor 14, the parameter estimator 15, a parameter estimation machine provided with the first simulator and a simulation machine provided with the second simulator being wiredly connected. Further, the model generation machine, the parameter estimation machine and the simulation machine described above may be independent apparatuses, and the air-conditioning system evaluation apparatus may be configured by each of the machines wirelessly transmitting/receiving data.

The described flowcharts are mere examples, and processing order and the like are not limited if a required processing result can be obtained. For example, steps S203, S204 and S205 shown in FIG. 4 may be performed in parallel, or in order of step numbers, or the order may be changed. Processing results of the processes may be sequentially stored into the storage 12, and each component may refer to the storage 12 to acquire a processing result.

Second Embodiment

In a second embodiment, the user or the like sets model specificity. The model specificity shows specificity of a simulation model. For example, information for separating a target building into a plurality of rooms is included. Since the user or the like can set the model specificity, it is possible to evaluate an air-conditioning system of a building more flexibly. The second embodiment is similar to the first embodiment except that the input interface 11 accepts the model specificity from the user or the like, and the model generator 13 generates a model in consideration of the accepted model specificity. Description of points similar to those of the first embodiments will be omitted.

The input interface 11 accepts model specificity in addition to building information. The specified model specificity may be, for example, a specification that the whole building is regarded as one room or a specification that the whole building is divided in two rooms. Otherwise, a specification is also possible that the building is divided into the top floor, the lowest floor and other Intermediate floors. Otherwise, a standard to be satisfied by model elements such as ISO 13790:2008 may be specified, or a simulation tool like EnergyPlus may be specified.

Figure 12A:
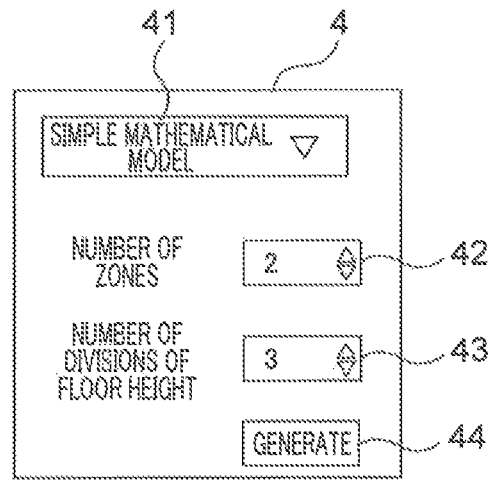
FIGS. 12A, 12B and 12C are diagrams illustrating an example of an interface for setting a level of detail of a model.

FIG. 12 is a diagram illustrating an example of an interface for setting model specificity. Hereinafter, the interface for setting model specificity will be referred to as a model specificity setting interface. For example, when the user sets model specificity, the input interface 11 displays a model specificity setting interface 4 illustrated in FIG. 12A on a display or the like that is wiredly or wirelessly connected. A kind specification area 41 is an area for setting the kind of model specificity to be specified. A number-of-zones specification area 42 is an area for inputting the number into which a horizontal surface of a building is divided (the number of zones). A number-of-divisions-of-floor-height specification area 43 is an area for inputting the number into which a vertical surface of a building is divided (the number of divisions of floor height). A generated room model has the number of rooms corresponding to the number calculated by the number of zones×the number of divisions of floor height. A generation button 44 is a button. When the button is pressed down, an instruction is sent to the model generator 13 to generate a room model on the basis of inputted information. In the example of FIG. 12, since 2 and 3 are inputted as the number of zones and the number of divisions of floor height, respectively, six room models are generated.

Figure 12B:
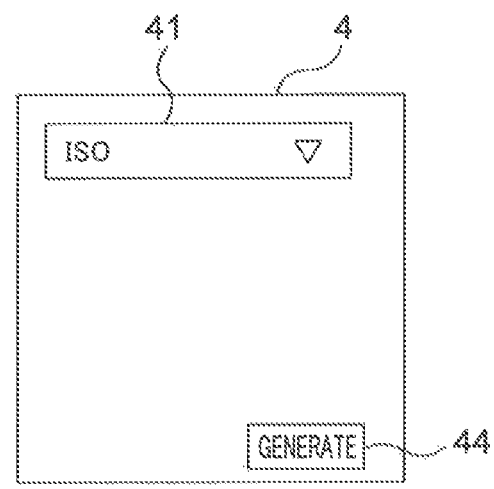
Figure 12C:
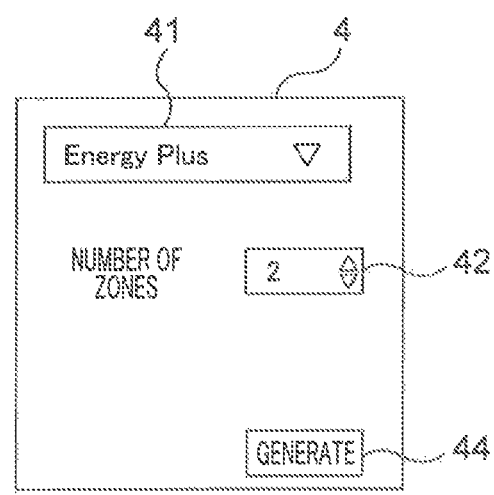

Further, by a kind shown in the kind specification area 41 being changed, the model specificity setting interface 4 may be changed to a screen corresponding to the kind. For example, a screen obtained by changing "Expression model" of a pull-down menu shown in the kind specification area 41 of FIG. 12A to "ISO" and a screen obtained by changing "Expression model" to "EnergyPlus" are illustrated in FIG. 12B and FIG. 12C, respectively. In FIGS. 12B and 12C, unselectable areas are not displayed according to a selected kind. Thus, the model specificity setting interface 4 may display a screen corresponding to a specified kind.

The model generator 13 of the second embodiment generates a room model on the basis of specificity specified by the model specificity setting interface 4. That is, the model generator 13 generates the number of room models corresponding to the specified number. When a plurality of room models are specified, each room model includes an inter-room model heat exchange Expression.

Figure 13:
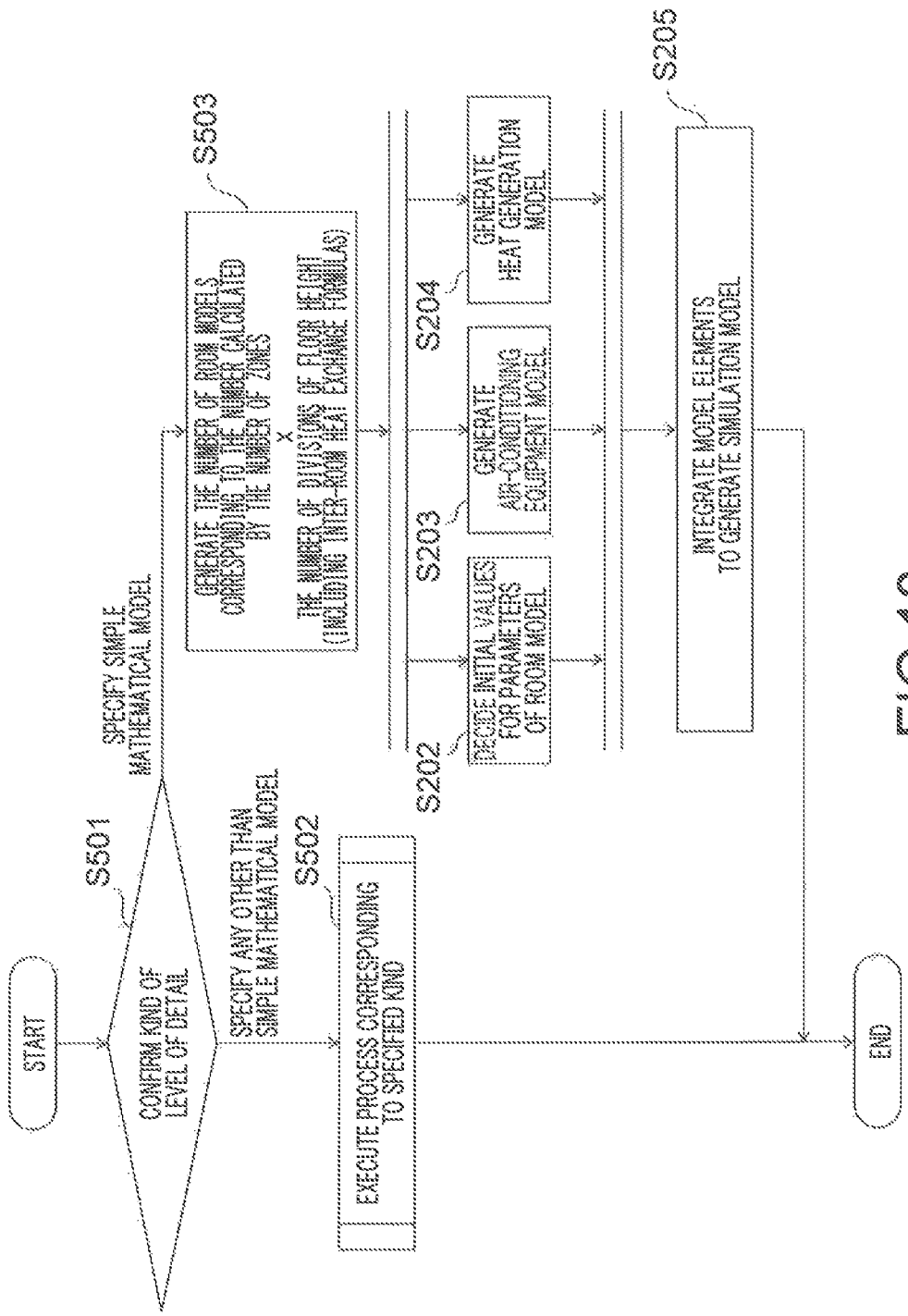
FIG. 13 is a diagram illustrating an example of a flowchart of a process of a model generator according to a second embodiment.

FIG. 13 is a diagram illustrating an example of a flowchart of the process of the model generator according to the second embodiment. The model generator 13 confirms the kind of specified model specificity and, if any other than Expression model (S501: specify any other than simple mathematical model), executes a process corresponding to the specified kind (S502). For example, if the ISO standard is specified, a parameter file for a simulation model may be outputted. Further, if a simulation tool is specified, a model corresponding to the simulation tool may be generated. If Expression model is specified (S501: specify simple mathematical model), the model generator 13 generates the number of room models corresponding to the number calculated by the number of zones×the number of divisions of floor height (S503). Then, similar to the first embodiment, the process from S202 to S205 is performed to generate a simulation model. Thereby, the room models generated on the basis of the specificity are included in the simulation model. The above is a flow of the process of the model generator 13 according to the second embodiment.

As described above, according to the present embodiment, the user or the like can set model specificity. Thereby, it becomes possible to evaluate an air-conditioning system according to the actual situation of a building more.

Third Embodiment

In a third embodiment, the user or the like sets building operation information. The building operation Information may be Information about operation of a building. Alternatively, the building operation information may be facilities or equipment in the building. Further, a condition about the building operation information is included in conditions for model order reduction possibility, and the building operation information is used to judge the condition.

In the third embodiment, the input interface 11 accepts the building operation Information in addition to building information and the like. Further, the model reduction processor 14 judges conditions for model order reduction possibility on the basis of the building operation Information and reduces order of a simulation model. The input interface 11 may display a building operation Information setting interface, which is an interface for accepting the building operation Information, on a display or the like that is wiredly or wirelessly connected. Further, the input interface 11 may receive a file in which the building operation Information is stored. Further, the input interface 11 may refer to an external storage device in which the building operation information is stored. Except the above points, the present embodiment may be similar to the above embodiments. Description of points similar to those of the above embodiments will be omitted.

The building operation information may be information about an operation schedule about a building, or facilities or equipment in the building. FIG. 14 is a diagram illustrating an example of conditions for model order reduction possibility according to the third embodiment. In comparison with the list of conditions for model order reduction possibility in FIG. 6, a condition for model order reduction possibility with an ID of 3a is added. This is a condition that, since equipment other than continuously operating equipment can be regarded as being stopped outside operating hours of a building specified in advance, order of a heat generation model about Indoor equipment other than the continuously operating equipment is reduced. Further, a condition for model order reduction possibility with an ID of 4a is added. This is a condition that, since the number of persons existing in the room is extremely small outside the operating hours of the building specified in advance, order of an indoor human body heat generation model is reduced. Thus, it is possible to reduce order of a heat generation model on the basis of the building operation information.

Though the building operation Information is operation hours of the whole building in FIG. 14, the building operation information may be individual pieces of operation information about a room and facilities. For example, the building operation information may be business hours of a room when the room is an office or a store. Since an amount of heat generation in a room outside business hours is estimated to be small, a condition for model order reduction possibility can be set that, outside business hours when the intended use of the room is an office or a store, order of a heat generation model of the room is reduced. Further, the building operation information may be information showing specific time-series transition of the number of living bodies in a room. In that case, a condition for model order reduction possibility can be set that, in a time zone in which the number of living bodies in the room becomes smaller than a predetermined number, order of a heat generation model of the room can be reduced. For example, a condition for operation of equipment may be operating time of air-conditioning. In that case, outside the operating time, order of a relevant air-conditioning equipment model can be reduced.

The intended use of a room is not especially limited. In addition to an office and a store, a residence, a warehouse and the like are also possible. The operation schedule of a room may be based on a time during which the room is open or a time during which the room is closed, in addition to business hours. Facilities in a building are not especially limited. Further, an operation schedule of facilities may be based on an idling time during which the facilities have been started but in a waiting state, in addition to information by which start/stop of the facilities can be judged. Further, the operation schedule may be not a schedule for one day but a long-term schedule for a week or a month. For example, a schedule of a monthly holiday or the like is also possible.

In the embodiments so far, it is possible to make a Judgment, for example, that the number of persons existing in a room is extremely small on the basis of measurement data and to perform model order reduction. For that purpose, however, it is necessary to prepare, for each room, a sensor for measuring the number of persons entering/leaving the room. In the present embodiment, however, measurement data for making a judgment is unnecessary, and, therefore, it is possible reduce cost for collecting the measurement data.

Thus, by accepting the building operation information, model order reduction based on the building operation information becomes possible, and it is possible to generate a more reduced order model.

As described above, according to the present embodiment, it is possible to set conditions for model order reduction possibility using building operation information, and, therefore, it is possible to generate more appropriate reduced order models.

Fourth Embodiment

In a fourth embodiment, the user or the like specifies sequential order of reduced order models for which parameters are to be estimated. In the embodiments so far, the parameter estimator 15 estimates parameters for reduced order models in descending order of the number of reduced order model elements of the reduced order models. In the present embodiment, the parameter estimator 15 estimates parameters of reduced order models on the basis of specified sequential order. Description of points similar to those of the embodiments so far will be omitted.

The output interface 17 outputs information about reduced order models calculated by the model reduction processor 14. For example, the reduced order model information illustrated in FIG. 9 may be outputted.

The input interface 11 accepts sequential order of reduced order models for which estimates of parameters are to be calculated, in addition to building information and the like. Sequential order may be specified for all the reduced order models or may be specified for a part of the reduced order models. The input Interface 11 may display a parameter estimation order specification interface, which is an interface for accepting order of parameter estimation, on a display or the like that is wiredly or wirelessly connected. Further, a file in which the order of parameter estimation is stored may be received. Further, an external storage device in which the order of parameter estimation is stored may be referred to.

The parameter estimator 15 sets the order of the reduced order models for which estimates of parameters are to be calculated to the sequential order accepted by the input Interface 11. When the order is given to a part of the reduced order models, the parameter estimator 15 decides order for the remaining reduced order models similarly to the above embodiments. Thereby, in a flow illustrated in FIG. 10, estimates of parameters are calculated for the reduced order models not in descending order of the number of reduced order model elements but in accepted sequential order.

By accepting the sequential order of estimation of parameters, it becomes possible to reflect a judgment based on the user's experience, such as a judgment that a parameter fluctuated little by operation conditions is estimated first, on the process of parameter estimation.

Figure 15:
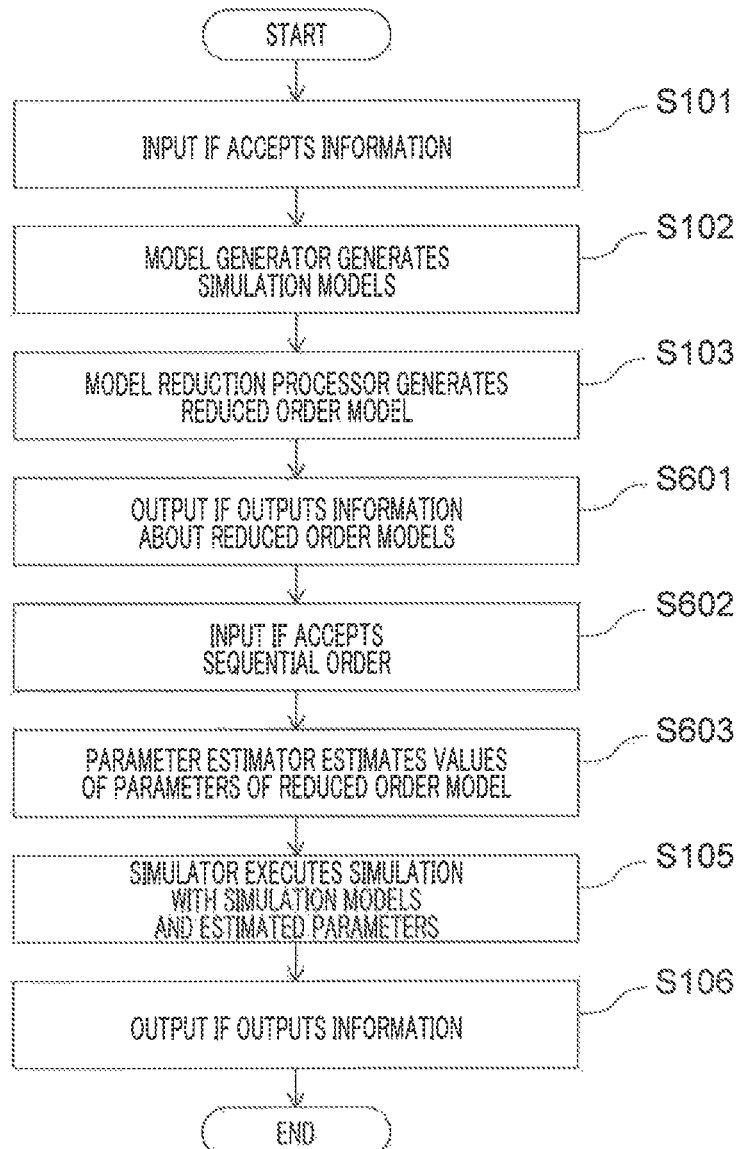
FIG. 15 is a diagram Illustrating an example of a schematic flowchart of an overall process of an air-conditioning system evaluation apparatus according to a fourth embodiment.

FIG. 15 is a diagram illustrating an example of a schematic flowchart of an overall process of an air-conditioning system evaluation apparatus according to the fourth embodiment. A process from the steps S101 to S103 Is similar to that of the first embodiment. After the model reduction processor 14 generates reduced order models, the output interface 17 outputs information about the reduced order models (S601). Then, the input interface 11 accepts sequential order inputted by the user or the like on the basis of the outputted Information (S602). The sequential order is sent to the parameter estimator 15. The parameter estimator 15 processes the reduced order models according to the sequential order and estimates values of parameters of the reduced order models (S603). The subsequent flow is similar to the flow of the embodiments so far. The above is a schematic flow of the whole process of the air-conditioning system evaluation apparatus 1 according to the fourth embodiment.

As described above, according to the present embodiment, since the user or the like can specify sequential order of reduced order models for which parameters are to be estimated, it is possible to evaluate an air-conditioning system of a building more flexibly.

Fifth Embodiment

In a fifth embodiment, the user or the like inputs a simulation condition showing a condition for simulation for an air-conditioning system. In the fifth embodiment, the input interface 11 accepts a simulation condition from the user or the like, and the simulator 16 performs simulation for the air-conditioning system on the basis of the simulation condition. The present embodiment can be regarded as being similar to the embodiment so far except the above point. Description of points similar to those of the embodiments so far will be omitted.

The simulation condition may be, for example, a condition that a particular variable included in a simulation model of the air-conditioning system is caused to fluctuate, and the remainder are caused to be constants. Further, a range of the variable caused to fluctuate may be specified, or a plurality of candidates for a value that can be taken may be specified.

Figure 16:
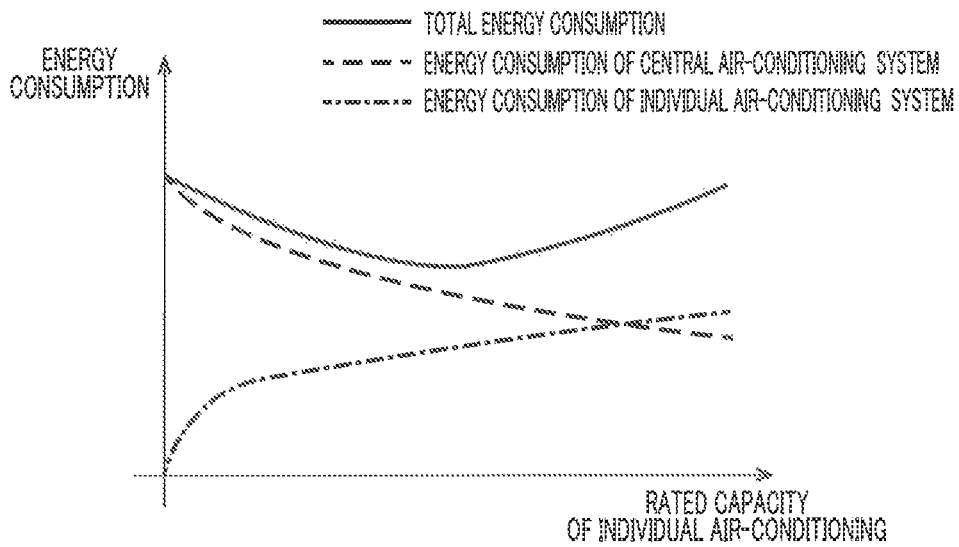
FIG. 16 is a diagram Illustrating an example of a simulation result of an air-conditioning system according to a fifth embodiment.

FIG. 16 is a diagram illustrating an example of a simulation result of the air-conditioning system according to the fifth embodiment. The simulation result in FIG. 16 is an example of a simulation result in a case where a simulation condition is specified that, when a building adopts central air-conditioning and Individual air-conditioning together, a rated capacity of individual air-conditioning is changed. Energy consumption according to change in the rated capacity of individual air-conditioning is shown. In FIG. 16, it is shown that, as the rated capability of individual air-conditioning increases, energy consumption of central air-conditioning decreases. However, total energy consumption falls at first but rises from a certain point. Therefore, it is seen that it is not necessary to make the rated capability of central air-conditioning larger than the rated capability at this point. Therefore, at the time of renewing central air-conditioning, the rated capability of individual air-conditioning can be an indicator for decision.

Figure 17:
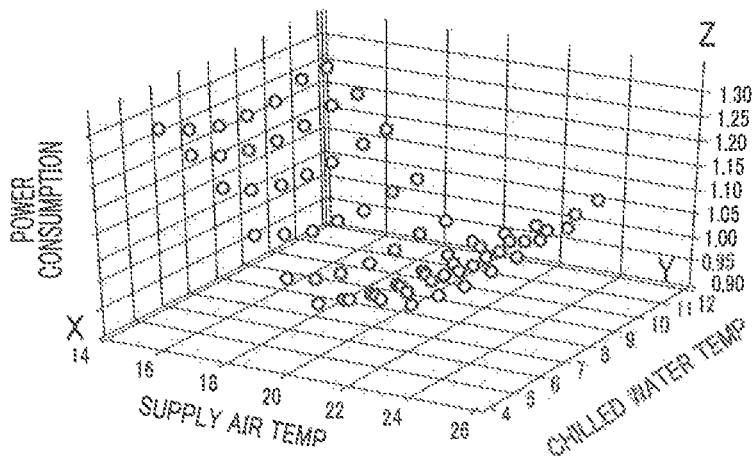
FIG. 17 is a diagram illustrating another example of the simulation result of the air-conditioning system evaluation apparatus according to the fifth embodiment.

FIG. 17 is a diagram illustrating another example of the simulation result of the air-conditioning system according to the fifth embodiment. An X axis indicates air supply temperature. A Y axis indicates temperature of chiller cold water used for the air-conditioning system (chiller cold water temperature). A Z axis indicates power consumption. Each point shown in FIG. 17 indicates a result of simulation performed by changing values of the air supply temperature and the chiller cold water temperature. At the time of performing such simulation, such a simulation condition is inputted that restricts ranges of the air supply temperature according to the air-conditioning system and the chiller cold water temperature according to the standard of chiller/water cooler. By doing so, simulation for an unnecessary range can be excluded.

The simulation condition may be calculated by the simulator 16. For example, the simulator 16 may calculate a simulation condition showing a range of the value of a variable such as outside temperature, from a location of a building and information about weather around the building inputted by the user. Further, from types, model names, setting Information or operation schedules of the air-conditioning system, equipment belonging to the air-conditioning system, a chiller/boiler or the like, ranges of values that variables of these pieces of equipment can take may be specified. For example, in a case where a model name of an air-conditioner is specified, the simulator 16 may refer to air-conditioning characteristics in the storage 12 and extract a range that the amount of air supply of the model can take, on the basis of the model name. The setting information includes target temperature, blowing temperature, air quantity, an operation mode and the like. Further, a simulation condition about an amount of heat generation may be calculated from a schedule of movement of persons in a building, business hours of facilities and the like. Thus, a simulation condition based on information about a building or facilities or equipment in the building may be generated, and simulation for a simulation model may be performed on the basis of the simulation condition.

As described above, according to the present embodiment, it is possible to obtain a simulation result under a desired condition.

Each process in the embodiments described above can be implemented by software (program). Thus, the embodiments described above can be implemented using, for example, a general-purpose computer apparatus as basic hardware and causing a processor mounted in the computer apparatus to execute the program.

Figure 18:
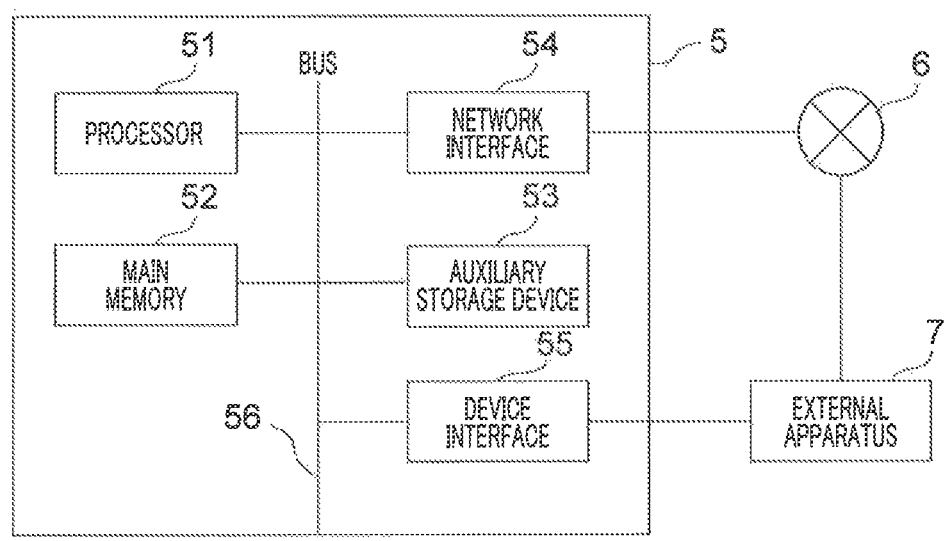
FIG. 18 is a block diagram illustrating an example of a hardware configuration in one embodiment of the present invention.

FIG. 18 is a block diagram Illustrating an example of a hardware configuration in one embodiment of the present invention. Each of an air-conditioning system evaluation apparatus and a parameter estimation apparatus can be realized as a computer apparatus 5 provided with a processor 51, a main memory 52, an auxiliary storage device 53, a network Interface 54 and a device interface 55, which are connected to one another via a bus 56.

Each of the air-conditioning system evaluation apparatus and a parameter estimation apparatus in the present embodiment may be realized by installing a program to be executed in each apparatus into the computer apparatus 5 in advance or may be realized by storing the program into a recording medium such as a CD-ROM or distributing the program via a network, and appropriately installing the program into the computer apparatus 5.

The processor 51 is an electronic circuit including a control device and an arithmetic unit of the computer. The processor 51 performs arithmetic processing on the basis of data inputted from each device or the like which is an internal component of the computer apparatus 5 or the program and outputs an arithmetic operation result and a control signal to each device or the like. Specifically, the processor 51 executes an OS (operating system) of the computer apparatus 5, an application or the like to control each device constituting the computer apparatus 5. Each process of each component of the air-conditioning system evaluation apparatus and the parameter estimation apparatus can be realized by the processor 51.

The processor 51 is not especially limited if the processor 51 can perform the processes described above. The processor 51 may be, for example, a general-purpose processor, a central processing unit (CPU), a microprocessor, a digital signal processor (DSP), a controller, a microcontroller, a state machine or the like. Further, the processor 51 may be incorporated in an application specific integrated circuit, a field programmable gate array (FPGA) or a programmable logic device (PLD). Further, the processor 51 may be configured with a plurality of processing devices. For example, the processor 51 may be a combination of a DSP and a microprocessor or may be one or more microprocessors that are in cooperation with a DSP core.

The main memory 52 is a storage device storing instructions to be executed by the processor 51, various pieces of data and the like, and information stored in the main memory 52 is directly read out by the processor 51. The auxiliary storage device 53 is a storage device other than the main memory 52. The storage device means any electronic part capable of storing electronic information. As the main memory 52, a volatile memory used for temporary storage of information, such as a RAM, a DRAM and an SRAM, is used. In the embodiment of the present Invention, however, the main memory 52 is not limited to these volatile memories. Storage devices used as the main memory 52 and the auxiliary storage device 53 may be volatile memories or may be nonvolatile memories. Nonvolatile memories include a programmable read-only memory (PROM), an erasable programmable read-only memory (EPROM), an electrically erasable PROM (EEPROM), a nonvolatile random access memory (NVRAM), a flash memory, an MRAM and the like. Further, a magnetic or optical data storage may be used as the auxiliary storage device 53. As the data storage, a magnetic disk such as a hard disk, an optical disk such as a DVD, a flash memory such a USB memory, a magnetic tape or the like may be used. The storage 12 is realized by the main memory 52 or the auxiliary storage device 53.

If the processor 51 performs reading or writing of information, or both of them directly or indirectly from or to the main memory 52 or the auxiliary storage device 53, the storage device can be said to electrically communicate with the processor 51. The main memory 52 may be integrated with the processor 51. In this case also, the main memory 52 can be said to electrically communicate with the processor 51.

The network interface 54 is an interface for connecting to a communication network wirelessly or wiredly. As the network interface 54, a network interface compliant with existing communication standards can be used. Though one network Interface 54 is shown here, a plurality of network interfaces 54 may be mounted. An output result or the like may be transmitted by the network interface 54 to an external apparatus 7 that is communicatively connected via a communication network 6. The external apparatus 7 may be an external storage medium, may be an input device or an output device, or may be a storage realizing the storage 12.

The device interface 55 is an interface, such as a USB interface, connected to an external storage medium for recording an output result and the like. The external storage medium may be any recording medium such as an HDD, CD-R, CD-RW, DVD-RAM, DVD-R and SAN (storage area network). The external storage medium may be connected to, for example, the storage realizing the storage 12 via the device interface 55. Further, the external storage medium may be connected to an input device such as a keyboard, a mouse and a touch panel and an output device such as an LCD (Liquid Crystal Display), a CRT (cathode ray tube), a PDP (plasma display panel) and a speaker.

The input interface 11 and the output interface 17 can Input and output information to and from the Input device and the output device via the network Interface 54 or the device interface 55.

Further, a part or all of the computer apparatus 5, that is, a part or all of the air-conditioning system evaluation apparatus or the parameter estimation apparatus may be configured with a dedicated electronic circuit (that is, hardware) such as a semiconductor integrated circuit implemented with the processor 51 and the like. The dedicated hardware may be configured in combination with a storage device such as a RAM and a ROM.

Though one computer apparatus is shown in FIG. 18, software may be Installed in a plurality of computer apparatuses. A process result may be generated by each of the plurality of computers executing a different part of processing of the software.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An air-conditioning system evaluation apparatus including a parameter estimation apparatus for calculating estimates for a plurality of parameters of a simulation model for simulating an air where the air-conditioning system is installed, the simulation model including one or more models among a plurality of models for calculating physical quantities output by a plurality of objects arranged in the air environment, the plurality of models each including part of the plurality of parameters, and the air-conditioning system evaluation apparatus comprising:

a memory configured to store a plurality of measurement data sets corresponding to a plurality of time periods, which are acquired by sensors, the plurality of measurement data sets each including input variables of the plurality of models; and at least one processor programmed to generate the simulation model for each of the plurality of time periods based on each of the plurality of measurement data sets, wherein the at least one processor is programmed to:
determine whether each of conditions associated with at least one model among the plurality of models is satisfied based on each of the measurement data sets, the conditions each being a condition for model order reduction performed when the condition is satisfied, the model order reduction including that the model associated with the satisfied condition is omitted from the simulation model or at least one predetermined term including the input variable in the model associated with the satisfied condition is fixed to a specific value, perform the model order reduction for at least one model associated with at least one condition satisfied among the conditions and connect models remaining after the model order reduction each other by connecting an output of one model of the models and an input of another model of the models if a variable name corresponding to the output of the one model is identical to a variable name corresponding to the input of the another model to obtain a reduced order model being the simulation model for each of the plurality of time periods, calculate estimates of parameters of a first reduced order model corresponding to a first time period of the plurality of time periods based on the measurement data set corresponding to the first time period, specify a parameter of a second reduced order model which is common with the first reduced order model among the parameters of the second reduced order model, the second reduced order model corresponding to a second time period of the plurality of time periods, and determine an estimate of the specified parameter to same value as the estimate of the parameter calculated for the first reduced order model, calculate an estimate of a parameter of the second reduced order model which is uncommon with the first reduced order model among the parameters of the second reduced order model based on the measurement data set corresponding to the second time period, calculate simulation results for the air-conditioning system by performing simulation based on the first reduced order model for the first time period and the second reduced order model for the second time period using the estimated parameters of the first reduced order model and the estimated parameters of the second reduced order model, respectively, and perform operation change of the air-conditioning system based on the simulation results for the first time period and the second time period.

2. The air-conditioning system evaluation apparatus according to claim 1, wherein the at least one processor calculates the estimates of the parameters of the first reduced order model prior to calculating the estimates of the parameters of the second reduced order model when a number of models included in the first reduced order model is larger than a number of models included in the second reduced order model.

3. The air-conditioning system evaluation apparatus according to claim 1, wherein
the simulation model includes a room model calculating an amount of heat of a room of a building provided with the air-conditioning system, an air-conditioning equipment model calculating an amount of heat generated by the air-conditioning system, and a model calculating an amount of heat generation by a heat source existing in the room.

4. The air-conditioning system evaluation apparatus according to claim 3, wherein
the at least one processor decides initial values for the parameters of the first reduced order model, based on information about an outline of the building provided with the air-conditioning system; and
the at least one processor decides whether the initial values are adopted as the estimates.

5. The air-conditioning system evaluation apparatus according to claim 4, wherein:
the at least one processor generates the room model based on a room model specificity setting; and
the room model generated based on the room model specificity setting is included in the simulation model.

6. The air-conditioning system evaluation apparatus according to claim 1, wherein
the conditions for model order reduction include a condition based on building operation information which is information about operation of a building provided with the air-conditioning system or operation of facilities or equipment in the building.

7. The air-conditioning system evaluation apparatus according to claim 6, wherein the building operation information includes at least information about an operation schedule of the building, or the facilities or equipment in the building.

8. The air-conditioning system evaluation apparatus according to claim 1, wherein the at least one processor further programmed to present:
an input interface configured to accept information; and
an output interface configured to output information; wherein
the output interface outputs information about the first reduced order model and the second reduced order model;
the input interface receives a sequential order of the first reduced order model and the second reduced order model in which the respective parameters are calculated; and
the at least one processor calculates the estimates of the parameters for the first reduced order model and the second reduced order model in the sequential order.

9. The air-conditioning system evaluation apparatus according to claim 1, wherein
the at least one processor makes judgments about whether candidate values are adopted as the estimates, based on simulation results for the candidate values and the measurement data sets corresponding to the first reduced order model and the second reduced order model, and causes the candidate values to be the estimates based on results of the judgments.

10. The air-conditioning system evaluation apparatus according to claim 1, wherein the simulation for the simulation model is performed based on a simulation condition based on information about a building, or facilities or equipment in the building.

11. The air-conditioning system evaluation apparatus according to claim 1, further comprising an output interface configured to output information to a user,
the at least one processor is configured to judge, for each of the plurality of periods, whether the plurality of conditions are satisfied based on each of the plurality of measurement data corresponding to the plurality of periods, and for each of the plurality of periods, generate determination result information indicating as to whether the plurality of conditions is satisfied or not, and
the output interface is configured to display the judgment result information in association with the corresponding measurement data for the plurality of periods.

12. An air-conditioning system evaluation method including a parameter estimation method for calculating estimates for a plurality of parameters of a simulation model for simulating an air environment of a space where the air-conditioning system is installed, the simulation model including one or more models among a plurality of models for calculating physical quantities output by a plurality of objects arranged in the air environment, the plurality of models each including part of the plurality of parameters, and the air-conditioning system evaluation method comprising:
storing, in a memory, a plurality of measurement data sets corresponding to a plurality of time periods, which are acquired by sensors, the plurality of measurement data sets each including input variables of the plurality of models;
determining whether each of conditions associated with at least one model among the plurality of models is satisfied based on each of the measurement data sets, the conditions each being a condition for model order reduction performed when the condition is satisfied, the model order reduction including that the model associated with the satisfied condition is omitted from the simulation model or at least one predetermined term including the input variable in the model associated with the satisfied condition is fixed to a specific value;
performing the model order reduction for at least one model associated with at least one condition satisfied among the conditions and connect models remaining after the model order reduction each other by connecting an output of one model of the models and an input of another model of the models if a variable name corresponding to the output of the one model is identical to a variable name corresponding to the input of the another model to obtain a reduced order model being the simulation model for each of the plurality of time periods;
calculating estimates of parameters of a first reduced order model corresponding to a first time period of the plurality of time periods based on the measurement data set corresponding to the first time period;

specifying a parameter of a second reduced order model which is common with the first reduced order model among parameters of the second reduced order model, the second reduced order model corresponding to a second time period of the plurality of time periods, and determining an estimate of the specified parameter to same value as the estimate of the parameter calculated for the first reduced order model;

calculating an estimate of a parameter of the second reduced order model which is uncommon with the first reduced order model among the parameters of the second reduced order model based on the measurement data set corresponding to the second time period;

calculating simulation results for the air-conditioning system by performing simulation based on the first reduced order model for the first time period and the second reduced order model for the second time period using the estimated parameters of the first reduced order model and the estimated parameters of the second reduced order model, respectively; and performing operation change of the air-conditioning system based on the simulation results for the first time period and the second time period.

13. A non-transitory computer readable medium having a computer program stored therein which causes a computer when executed by the computer, to perform an air-conditioning system evaluation method including a parameter estimation method for calculating estimates for a plurality of parameters of a simulation model for simulating an air environment of a space where the air-conditioning system is installed, the simulation model including one or more models among a plurality of models for calculating physical quantities output by a plurality of objects arranged in the air environment, the plurality of models each including part of the plurality of parameters, and the air-conditioning system evaluation method comprising:

storing, in a memory, a plurality of measurement data sets corresponding to a plurality of time periods, which are acquired by sensors, the plurality of measurement data sets each including input variables of the plurality of models;

determining whether each of conditions associated with at least one model among the plurality of models is satisfied based on each of the measurement data sets, the conditions each being a condition for model order reduction performed when the condition is satisfied, the model order reduction including that the model associated with the satisfied condition is omitted from the simulation model or at least one predetermined term including the input variable in the model associated with the satisfied condition is fixed to a specific value;

performing the model order reduction for at least one model associated with at least one condition satisfied among the conditions and connect models remaining after the model order reduction each other by connecting an output of one model of the models and an input of another model of the models if a variable name corresponding to the output of the one model is identical to a variable name corresponding to the input of the another model to obtain a reduced order model being the simulation model for each of the plurality of time periods;

calculating estimates of parameters of a first reduced order model corresponding to a first time period of the plurality of time periods based on the measurement data set corresponding to the first time period;

specifying a parameter of a second reduced order model which is common with the first reduced order model among parameters of the second reduced order model, the second reduced order model corresponding to a second time period of the plurality of time periods, and determining an estimate of the specified parameter to same value as the estimate of the parameter calculated for the first reduced order model;

calculating an estimate of a parameter of the second reduced order model which is uncommon with the first reduced order model among the parameters of the second reduced order model based on the measurement data set corresponding to the second time period;

calculating simulation results for the air-conditioning system by performing simulation based on the first reduced order model for the first time period and the second reduced order model for the second time period using the estimated parameters of the first reduced order model and the estimated parameters of the second reduced order model, respectively; and performing operation change of the air-conditioning system based on the simulation results for the first time period and the second time period.

\* \* \* \* \*

UNITED STATES PATENT AND TRADEMARK OFFICE
CERTIFICATE OF CORRECTION

PATENT NO. : 11,574,102 B2
APPLICATION NO. : 15/700399
DATED : February 7, 2023
INVENTOR(S) : Ena Ishii et al.

It is certified that error appears in the above-identified patent and that said Letters Patent is hereby corrected as shown below:

In the Claims

Claim 1, Column 22, Line 50, "among the parameters of the second" should read --among parameters of the second--.

Signed and Sealed this
Fifth Day of September, 2023

Katherine Kelly Vidal
*Director of the United States Patent and Trademark Office*